(12) United States Patent
Gupta et al.

(10) Patent No.: US 8,432,153 B2
(45) Date of Patent: Apr. 30, 2013

(54) TIME STRETCH ENHANCED RECORDING SCOPE

(75) Inventors: Shalabh Gupta, Los Angeles, CA (US); Bahram Jalali, Los Angeles, CA (US); Ali Motafakker-Fard, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 666 days.

(21) Appl. No.: 12/623,359

(22) Filed: Nov. 20, 2009

(65) Prior Publication Data

US 2010/0201345 A1 Aug. 12, 2010

Related U.S. Application Data

(60) Provisional application No. 61/117,011, filed on Nov. 21, 2008, provisional application No. 61/178,552, filed on May 15, 2009.

(51) Int. Cl.
*G01R 31/00* (2006.01)
(52) U.S. Cl.
USPC .......................................................... 324/96
(58) Field of Classification Search .............. 324/96, 324/762.01–762.1, 754.01–754.3; 356/301, 356/73.1; 359/331, 336; 707/702
See application file for complete search history.

(56) References Cited

U.S. PATENT DOCUMENTS 6,288,659 B1 9/2001 Jalali et al.
7,034,988 B2 * 4/2006 Tamai et al. ............... 359/326
7,821,633 B2 * 10/2010 Jalali et al. ................. 356/301

OTHER PUBLICATIONS

Gupta, S. et al.—"Time Warps in Photonic Time Stretch ADC and Their Mitigation"—2008 MWP/APMP, Sep. 9-Oct. 3, 2008, pp. 43-46.
Han, Y. et al.—"Adaptive Online Calibration in Time Stretched ADC Arrays"—IMTC 2003, May 20-22, 2003, Vail, CO., pp. 1212-1216.
International Search Report and Written Opinion from PCT counterpart application No. PCT/US09/065411—Filing Date: Nov. 20, 2009—Date of Mailing of report: Jul. 21, 2010.
Bhushan, A.S. et al.—"Time-stretched analogue-to-digital conversion"—Electronics Letters, 34(9), pp. 839-841, 1998.

(Continued)

*Primary Examiner* — Tung X Nguyen
(74) *Attorney, Agent, or Firm* — John P. O'Banion

(57) ABSTRACT

A time-stretched enhanced recording scope (TiSER) is described using time stretch analog-to-digital conversion in a real-time burst mode. A chirped optical signal is modulated in response to receiving segments of an input signal. The optical signal with its modulated input signal, is stretched through an optical medium and digitized to represent the waveform segment. TiSER provides ultra-fast real-time sampling within short segment bursts of the original input signal while providing an ability to detect non-repetitive events. Methods and apparatus are also described for providing real-time information about inter-symbol information (ISI), rapidly determining bit-error rates (BER), performing time-domain reflectometry (TDR), generating eye diagrams for serial data, facilitating digital correction of data, clock recovery, optical carrier phase recovery, and otherwise increasing the speed and/or accuracy of a diverse range of high-speed signal measurement and processing activities.

18 Claims, 19 Drawing Sheets

OTHER PUBLICATIONS

Han, Y. et al.—"Photonic Time-Stretched Analog-to Digital Converter: Fundamental Concepts and Practical Considerations"—Journal of Lightwave Technology, vol. 21, No. 12, pp. 3085-3103, 2003.

Chou, J. et al.—"Femtosecond real-time single-shot digitizer"—Applied Physics Letters, 91, 161105 (2007).

Gupta, S. et al.—"Time-warp correction and calibration in photonic time-stretch analog-to-digital converter"—Opt. Lett., vol. 33, No. 22, pp. 2674-2676, 2008.

Han, Y. et al.—"Ultrawide-Band Photonic Time-Stretch A/D Converter Employing Phase Diversity"—IEEE Transactions on Microwave Theory and Techniques, vol. 53, No. 4, pp. 1404-1408, 2005.

Stigwall, J. et al.—"Signal Reconstruction by Phase Retrieval and Optical Backpropagation in Phase-Diverse Photonic Time-Stretch Systems"—Journal of Lightwave Technology, vol. 25, No. 10, pp. 3017-3027, Oct. 2007.

Tarighat, A. et al.—"Two-Dimensional Spatio-Temporal Signal Processing for Dispersion Compensation in Time-Stretched Adc"—Journal of Lightwave Technology, vol. 25, No. 6, pp. 1580-1587, Jun. 2007.

Gupta, S. et al.—Distortion Cancellation in Time-Stretch Analog-to Digital Converter—Journal of Lightwave Technology, vol. 25, No. 12, pp. 3716-3721, Dec. 2007.

Motafakker-Fard, Ali et al.—"Digital Equalization of Ultrafast Data Using Real-time Burst Sampling"—to be presented at OFC conference 2010 at San Diego (Mar. 21-25).

Patrin, J. et al.—"Comparision and Correlation of Signal Integrity Measurement Techniques"—Proc. DesignCon Jan. 2002 High Performance System Design Conf., 2002.

Gupta, S. et al.—"Capturing Rogue Events with the Time-Stretch Recording Scope"—IEEE/OSA CLEO/Europe—EQEC 2009.

Hsu, R. et al.—"All-dielectric photonic-assisted radio front-end technology"—Nature Photonics, vol. 1, pp. 535-537, 2007.

Gupta, S. et al.—"Time stretch enhanced recording oscilloscope"—Applied Physics Letter, vol. 94, No. 4, 041105-1, 2009.

Dubovitsky, S. et al.—"Analysis and Improvement of Mach-Zehnder Modulator Linearity Performance for Chirped and Tunable Optical Carriers"—Journal of Lighwave Technology, vol. 20, No. 5, pp. 858-863, 2002.

Walden, R.H.—"Analog-to-digital converter survey and analysis"—IEEE Journal on Selected Areas in Communications, vol. 17, No. 4, 539-550, 1999.

* cited by examiner

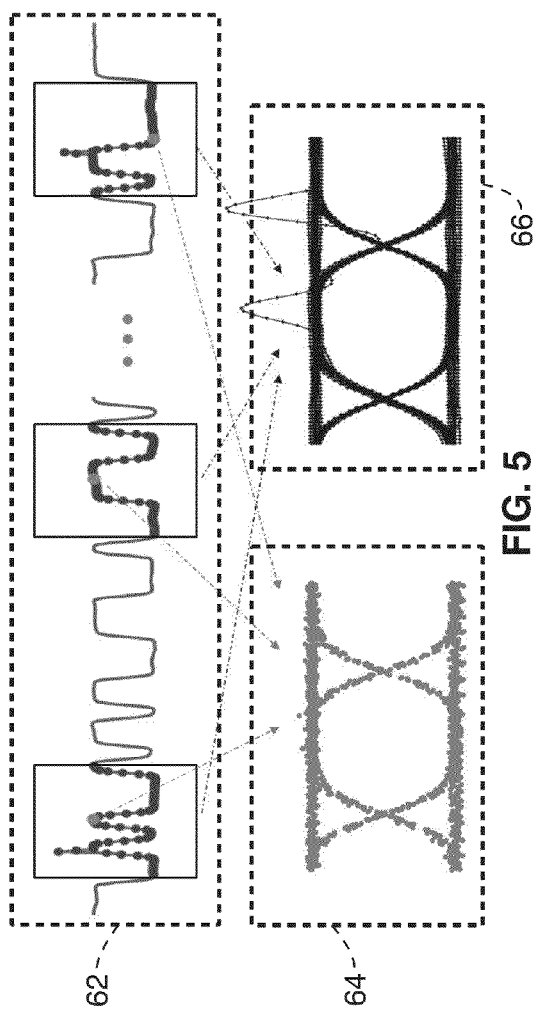
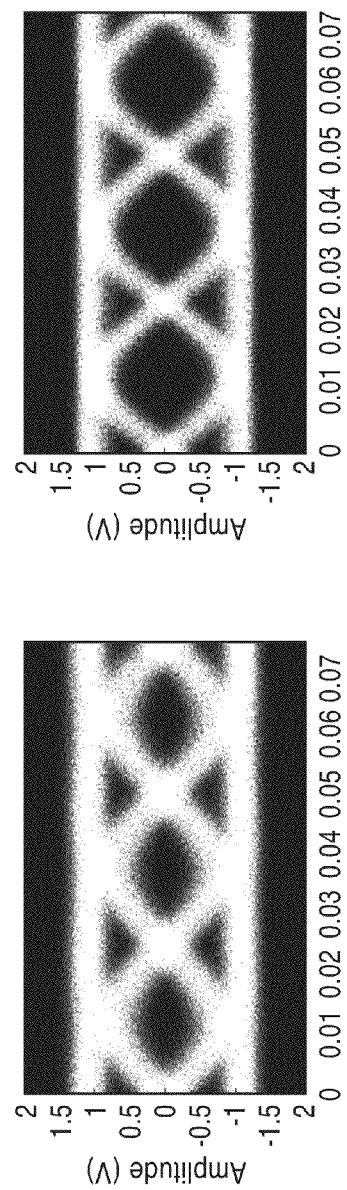
FIG. 5
FIG. 6A
FIG. 6B

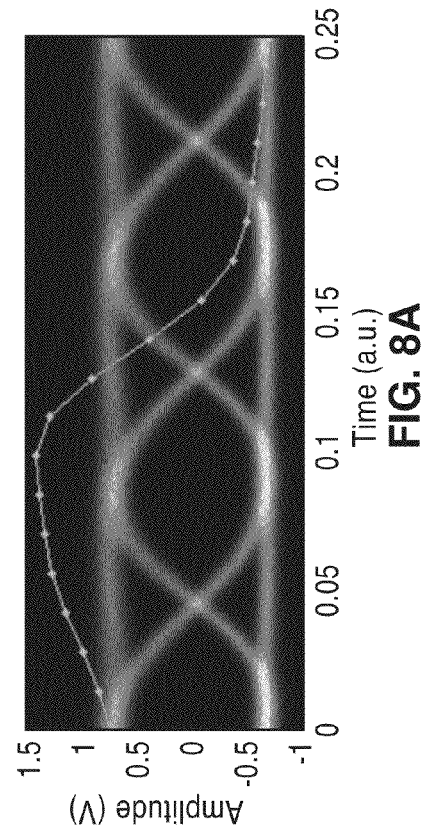
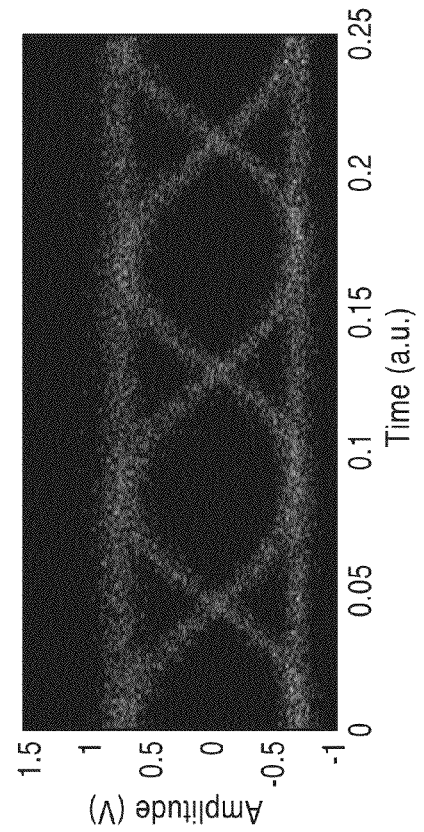
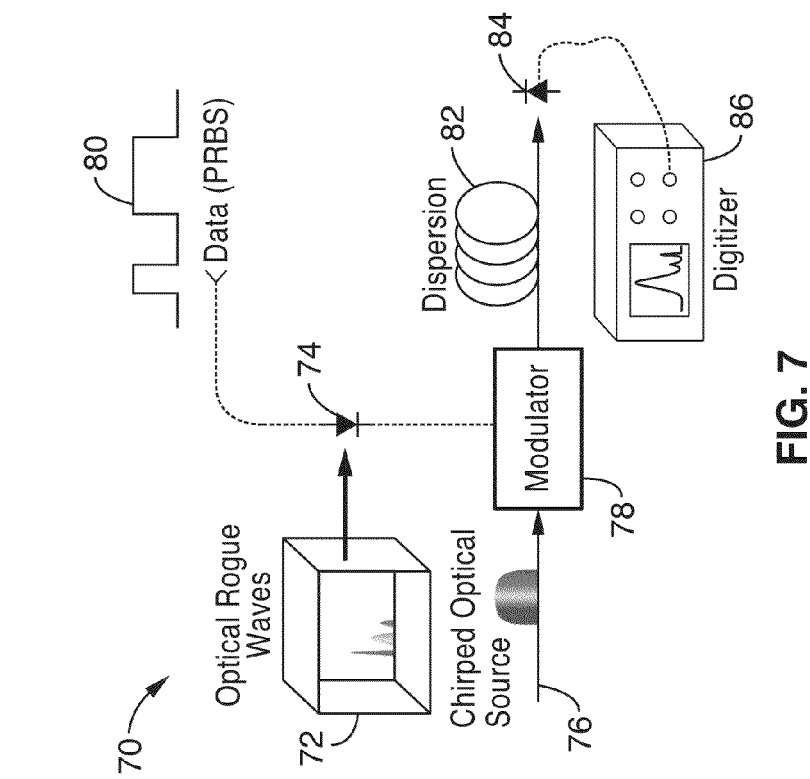

TIME STRETCH ENHANCED RECORDING SCOPE

CROSS-REFERENCE TO RELATED APPLICATIONS

This application claims priority to U.S. provisional application Ser. No. 61/117,011 filed on Nov. 21, 2008, incorporated herein by reference in its entirety, and to U.S. provisional application Ser. No. 61/178,552 filed on May 15, 2009, incorporated herein by reference in its entirety.

This application is also related to U.S. Pat. No. 6,288,659 which is incorporated herein by reference in its entirety.

STATEMENT REGARDING FEDERALLY SPONSORED RESEARCH OR DEVELOPMENT

This invention was made with Government support of Grant No. N66001-07-1-2007 awarded by DARPA. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to digital representation of electrical signals, and more particularly to oscilloscopes and signal processing for removing distortions in signals digitized using a Time Stretch Analog to Digital Converter (TS-ADC).

2. Description of Related Art

The ability to capture and analyze waveforms is critical for numerous apparatus and systems. At the center of this capturing ability are techniques for converting analog signals to digital signals within Analog-to-Digital Converters (ADCs).

Over the past few decades continued advances in the state of digital technology have made it possible to perform impressive amounts of signal processing and computation within the digital domain. Digital information provides a number of benefits, such as convenient storage (e.g., electronic, magnetic or optical memories) and reproduction. These advantages have brought about what is often referred to as the 'digital revolution' to enable easy storage, processing and transmission of vast amounts of information. However, most signals in the physical world are analog in nature requiring analog-to-digital converters (ADCs) to translate these signals to a digital representation. ADCs, therefore, are crucial components for the majority of modern day electronic devices. It is natural, therefore, that the demand for lower power, faster and higher resolution ADCs is continuing to grow.

Ultra-wideband high-resolution ADCs, in particular, are required for a number of extremely important applications. For example, to satisfy the increasing bandwidth demands for Internet backbones and data centers, optical links are being tested which achieve data rates as high as 100-Gbps per wavelength channel. Examples include the 100G Ethernet for local area networks and the 100G transport for long-haul portion of the networks. These links are configured for using advanced modulation formats to achieve high spectral efficiencies. To demodulate these signals and to correct for the impairments suffered by data after it propagates through the optical transmitter, fiber and receiver, the receivers in these extremely fast optical links require ADCs with bandwidths in the tens of GHz range. High-speed ADCs are also increasingly finding applications in advanced test and measurement equipment, radar systems, software defined radios and bio-medical instrumentation. Test and measurement equipment is required for capturing high-speed signals up to these 100-GHz frequencies, for example, the signals used in millimeter-wave radios and vehicular radar systems.

The majority of ADCs used today in digitizing electrical signals are based on CMOS electronics. Architectural improvements and availability of faster devices have made it possible to extensively rely on signal processing and calibration techniques, which has improved the performance of these ADCs. However, these improvements cannot fully satisfy the growing demand for wide-bandwidth high-resolution ADCs. Certain fundamental issues also exist associated with the use of the electronics, such as error in the sampling clock referred to as aperture jitter, and the finite switching time of transistors that lead to an error referred to as comparator ambiguity. These fundamental issues limit the speeds of electronic ADCs, or at a given speed limit their resolution. Therefore, it becomes imperative to use other technologies such as photonics, to overcome these inherent limitations of electronics. Photonic Time Stretch Analog-to-Digital Conversion (TS-ADC), such as represented by FIG. 3, is a technique previously developed by the Applicant (e.g., U.S. Pat. No. 6,288,659) that uses optics to slow down high speed analog signals in time by manipulating the signal time scales, allowing them to be captured by electronic ADCs operating at below the capture speeds.

FIG. 1 illustrates a block diagram of a photonic time-stretch pre-processor 10. The system is effectively a dispersive analog optical link having an optical source 12, Mach-Zehnder (MZ) modulator 24, dispersion element 26 and photodetector (PD) 28. The continuous wave laser source of the link is replaced for this application with a chirped pulse source 12, such as having a Mode-Locked Laser (MLL) 14, Highly Non-Linear Fiber (HNLF) 16, supercontinuum pulse 18 providing a signal, shown at node A, which is passed through dispersion fiber 20 for outputting chirped pulse 22 at node B.

Prior to the photonic time stretching, the electrical input signal 23 is received by a modulator 24 which controls the modulation of the linearly chirped optical femtosecond (fs) mode-locked laser pulses as seen at node C. Propagation of these pulses through dispersive fiber 26 stretches the modulated pulses with respect to time as seen at node D.

A photodetector (PD) 28 converts these optical signals back to the electrical domain and the resultant electrical signal is a stretched replica of the original signal with significantly reduced analog bandwidth, as represented by signal 30 shown in the figure. This signal can now be recorded by a real-time electronic digitizer. It should be appreciated that only as a result of the time-stretching, does the ADC have sufficient bandwidth to convert the signal, as the ADC by itself is not fast enough to capture the original signal. Time stretch factors of up to 250 have been achieved with this approach, and electrical signals with frequencies as high as 95-GHz have been digitized in real-time at 100-fs intervals using the TS-ADC.

It should be readily recognized, however, that time stretch preprocessing can add distortion to the signal being recorded. The sources of this distortion include, but are not limited to, dispersion penalty that creates fading or nulls at certain signal frequencies, intermodulation and harmonic distortion caused by the fundamentally non-linear transfer function of the electro-optic modulator, dispersion induced non-linear distortion, non-linear distortion caused by saturation of the photodetector at high optical powers, distortion caused by nonlinear optical interaction within the dispersive medium, and non-uniform, time-dependent, stretch factors which create time-warps.

FIG. 2 depicts time stretched signals with: (1) the solid trace showing an ideal signal without time-warp; (2) dashed traces showing a signal with time-warp; (3) trace with squares represents error; and (4) the trace with circles representing amplitude of the time-warp.

Bandwidth limitations caused by dispersion can be overcome using several techniques, such as phase diversity, single sideband modulation, and equalization techniques. Prior work by the Applicant has shown that significant amounts of non-linear distortion due to various sources can be suppressed by differential operation and arcsine correction. However, non-linear distortion added by dispersion effects, Mach-Zehnder modulator (MZM) transfer function and MZM wavelength dependent bias offsets comprise the dominant portions of the residual non-linear distortion.

FIG. 3 illustrates a photonic time stretch ADC in which an RF electrical signal is segmented and stretched, digitized by slow backend digitizers, and then finally combined to obtain the digital copy of the original signal. The figure also depicts changes in the signal spectrum due to the stretching.

In the figure is shown a mechanism 50 for capturing the time-stretched signal continuously, by dividing the RF signal 52 into multiple segments 56a-56d (e.g., which may comprise any desired number of segments) using wavelength division demultiplexing (WDM) 54 (e.g., filter(s)). The use of WDM assures that the stretched signal segments do not overlap and intermix with each other after stretching. The time-stretched and slowed signal segments are then converted to digital samples by slow electronic ADCs 58a-58d. It should be appreciated that the term "slow", as used in this respect, only means a device that has insufficient speed for directly converting RF signal 52. Finally, these samples are collected 60 by a digital signal processor (DSP) and rearranged 62 in order to get the output signal as the digital representation of the original analog signal. Any distortion added to the signal by the time-stretch pre-processor is also removed by programming within the DSP (e.g., any processor or combination of processors which process the digital signals) performing according to aspects of the present invention.

Devices for capturing signal waveforms, such as digitizers and oscilloscopes, rely on analog-to-digital conversion. At its current state of the art, digitizers and scopes (oscilloscopes) are categorized into two classes. Equivalent-time digitizers (or sampling oscilloscopes) rely on repetitive or a clock synchronous nature of the signals to reconstruct them in time. In a sampling oscilloscope, the signal is sampled at MHz frequencies (typically 100-kHz to 10-MHz) and then reconstructed digitally, requiring a long time to obtain the original signal with high fidelity. While they can reach equivalent time bandwidths of up to 100-GHz, they are not capable of capturing non-repetitive waveforms. Even for repetitive signals, they cannot provide real-time information about the dynamics that occur at rates faster than a few MHz. Equivalent-time sampling is similar to the strobe light technique used for measuring cyclical events which are much faster than the speed of the detector. For example, periodically flashing a strobe light on a vibrating tuning fork can make it appear to be vibrating very slowly and can be used for studying vibrations which are too fast for the human eye to discern.

The second type of digitizers, called real-time oscilloscopes, continually sample the signals as they change, but have input bandwidths limited to only a few GHz. The fastest practical real-time oscilloscope currently available has a bandwidth around 20 GHz.

Accordingly, a need exists for a system and method of converting fast waveforms into digital representations while not generating significant distortion. These needs and others are met within the present invention, which overcomes the deficiencies of previously developed ADC systems and methods.

BRIEF SUMMARY OF THE INVENTION

The present invention is an electrical signal measurement system that converts electrical signals in analog format to their digital representation for storage and analysis. A Time Stretch Enhanced Recording (TiSER) oscilloscope is taught for recording a high frequency signal in real time bursts. Signal processing methods are taught for removing distortion in a signal which was digitized using Time-Stretch Analog to Digital Conversion (TS-ADC), and stored thereof. A method is also taught for using the TS-ADC in burst sampling mode, which reduces the time required to measure signal characteristics, such as data bit error rates, and provides useful information about transients of ultra-fast signals that deviate from average behavior. Instruments currently available do not support such high speed operation, and are currently limited to high speed data below about 20 GHz because of the limited bandwidth of existing real-time digitizers.

TS-ADC operating modes described herein also offer a unique method to measure eye diagram for serial data and to measure bit error rates in far less time than is required by existing technologies. The invention provides a new type of wide bandwidth oscilloscope which can capture bursts of data in real time.

The technical section of this invention also describes methods and apparatus for recovering signals and removing distortion in a photonic Time Stretched Analog-to-Digital Converter (TS-ADC). These techniques can be used in a TiSER oscilloscope that is the subject of the present invention but they are more general and also pertain to the TS-ADC.

It should be appreciated that non-linear distortion added by dispersion effects, Mach-Zehnder modulator (MZM) transfer function and MZM wavelength dependent bias offsets are the dominant portions of the residual non-linear distortion. As it is signal dependent, and not random, this residual distortion can be suppressed using signal processing methods taught in the present invention. Time-warp distortion can also be suppressed using the correction method described as an aspect of the present invention.

The invention is amenable to being embodied in a number of ways, including but not limited to the following descriptions.

One embodiment of the invention is a time stretched enhanced recording (TiSER) oscilloscope, comprising: (a) a time stretch pre-processor configured for coupling segments of an input electrical signal into a pulsed optical waveform which is temporally stretched in response to interaction with a dispersive optical medium; (b) a real-time electronic digitizer configured for registering and digitizing the input signal in its stretched form as contained within the pulsed optical waveform; and (c) means for displaying the digitized input signal using its non-stretched original time scale for the oscilliscope, which is configured as a time-stretched enhanced recording oscilliscope.

One embodiment of the invention is an apparatus for measuring an input signal, comprising: (a) a pulsed optical source; (b) a modulator receiving the pulsed optical source and configured for modulating segments of a received electrical input signal over the pulsed optical source; (c) a dispersion element receiving the pulsed optical source from the modulator and stretching it in the time domain into a stretched optical source; (d) an optical detector receiving the stretched optical source and converting it into an analog signal; (e) an analog-to-digital converter (ADC) adapted for converting the stretched analog signal into a digital signal; (f) a processor configured for receiving the digital signal with programming executable on the processor for, (f)(i) assembling the digital signal into a desired format of representation for the input signal. The apparatus captures segments of the input signal in real-time and provides representation of fast repetitive signals and non-repetitive dynamics associated with the input signal. It will be appreciated that the analog-to-digital converter (ADC) for converting the electrical equivalent of the stretched optical source can thus operate at a substantially lower frequency than the input signal being captured by the apparatus. The input signal is stretched up to multiple orders of magnitude longer, allowing the use of an analog-to-digital converter circuit which can be orders of magnitude slower than the bandwidth of the input source.

In at least one implementation the chirped optical source is configured with a mode-locked laser (MLL) coupled through a highly non-linear fiber (HNLF) upon whose output is directed a supercontinuum pulse. In at least one implementation the dispersion element comprises dispersive optical fiber or Fiber Bragg Grating (FBG). In at least one implementation the modulator comprises a modulator selected from the group of modulators consisting of electro-optic modulators, Mach-Zehnder modulators and electro-absorption modulators. In at least one implementation the front end of the apparatus, comprising the modulator is capable of receiving high-voltage spikes exceeding approximately 1000 volts, without damage to the apparatus. In at least one implementation, at the modulator is separated from the remainder of the apparatus and coupled to it with optical fiber, thus protecting the bulk of the apparatus by distance and/or shielding and thus not subjecting these components to the same physical conditions as the modulator.

In at least one embodiment of the invention the apparatus is used for any of the following: (a) extracting signal information from clock synchronous signals from high speed serial data; (b) determining a bit-error rate (BER) from a high speed serial data stream toward reducing the time required to measure bit-error rate; (c) characterizing emerging high-speed serial data links selected from the group of high speed data links consisting of USB 3.0 targeting 5-Gbit/s serial data rates, PCI-Express at data rates up to 12.5-Gbit/s, OC-768 having data rates up to 43 Gbits/s, and Ethernet OTU4 having data rates up to 100-Gbits/s; (d) performing time-domain reflectometry (TDR) comprising averaging repetitive reflected waveforms over multiple scans toward increasing sensitivity and/or reducing test time; (e) reducing the effect of clock jitter of the electronic digitizer in response to digitizing of the stretched signals at a slower rate than would be required by the input signal being directly digitized; or (f) developing equalization filters and equalization algorithms for compensating for inter-symbol interference (ISI) and other memory effects in received data.

In at least one embodiment of the invention the apparatus is a time stretching single channel TiSER scope, or a time stretching ADC (TS-ADC) which includes digital signal processing to perform any one or more of the following distortion correction processing: (1) broadband linearization; (2) envelope distortion removal; (3) time warp distortion removal; (4) bias offset removal.

In at least one embodiment broadband linearization is performed by apparatus comprising: (a) a digital signal processor adapted for emulating the transfer function of the physical system and generating an emulated transfer function; (b) an amplitude doubler and an adder configured for receiving a scaled version of the output from the first equalization filter and subtracting the output of the second equalization filter to arrive at a linearized output for a time-stretched analog to digital converter (TS-ADC) which represents the original signal.

In at least one embodiment laser pulse envelope is removed by programming executable on a processor for removing the influence of the laser pulse envelope by steps comprising: (a) obtaining a maximum and a minimum of the pulse envelope across multiple pulses; (b) determining envelope size in response to the difference between the maximum and minimum pulse envelopes; (c) obtaining common mode noise in response to the sum of the maximum and minimum pulse envelopes; and (d) subtracting common mode noise from the differential and dividing by the envelope. In at least one mode of the invention the differential operation comprises subtracting a negative modulation signal from a positive modulation signal.

In at least one embodiment time-warp removal distortion is removed by programming executable on a processor comprising the steps of: (a) measuring of time-warp magnitude in response to capturing segments of a sample RF tone subject to a selected modulation; (b) aligning and concatenating any adjacent parallel wavelength channels; (c) fitting the resultant waveform to a curve for the selected modulation; (d) measuring the difference between the resultant waveform and the selected modulation; and (e) correcting time warp distortion within arbitrary input signals received by the TS-ADC in response to using interpolation of the sample amplitudes.

One embodiment of the invention is a method of capturing waveforms in a real-time burst sampling mode, comprising: (a) modulating a pulsed optical signal in response to receipt of an electrical input signal; (b) stretching pulses within the pulsed optical signal in the time domain to stretch the segments of the electrical input signal contained within the pulses; (c) analog-to-digital conversion of the stretched segments of the input signal, using an analog-to-digital converter, into a digital signal representing real-time burst samples of the input signal; and (d) representing the real-time burst samples in an original time scale of the input signal. The real-time burst sample represented in its original time scale comprises ultra-wideband signal segments captured in real-time at an equivalent sample rate exceeding the sample rate capability of the analog-to-digital converter.

The present invention provides a number of beneficial aspects which can be implemented either separately or in any desired combination without departing from the present teachings.

An aspect of the invention is a time-stretch enhanced recording (TiSER) oscilloscope which provides real-time sampling and storage of signals at rates which are orders of magnitude beyond that of existing scopes.

Another aspect of the invention is an electrical signal measurement system capable of recording high frequency signals (e.g., up to ~100 GHz) in real time bursts.

Another aspect of the invention is an electrical signal measurement system capable of reducing the time to perform signal measurements, including Bit Error Rate (BER), Time Domain Reflectometry (TDR), obtaining inter-symbol information (ISI), generating eye diagrams for serial data, facilitating digital correction of data, data clock recovery, optical carrier phase recovery, and other high speed signal processing activities.

Another aspect of the invention is distortion correction applicable to a time-stretched analog-to-digital converter.

Another aspect of the invention is correction of time-warp distortion for a time-stretched analog-to-digital converter.

Another aspect of the invention is correction of wavelength-dependent bias offsets for a time-stretched analog-to-digital converter.

Another aspect of the invention provides broadband linearization for a time-stretched analog-to-digital converter.

A still further aspect of the invention is the correction of laser-pulse envelope for a time-stretched analog-to-digital converter.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 5 is a waveform image depicting Real-time Burst Sampling (RBS) offered by the TiSER oscilloscope according to the present invention compared with equivalent time sampling which misses fast transients.

FIG. 6A-6B are waveform images (eye diagrams) of pseudo-random serial data captured according to an aspect of the present invention, shown before equalization (left), and after applying a linear four-tap feed forward equalizer (left).

FIG. 7 is block diagram of an experimental setup for testing the TiSER apparatus according to an aspect of the present invention.

FIG. 8A-8B are waveform images captured for a pseudo-random binary sequence (PRBS) corrupted by a transient (rogue) event as captured by a TiSER (FIG. 8A), compared with that of a sampling oscilloscope.

DETAILED DESCRIPTION OF THE INVENTION

Figure 1:
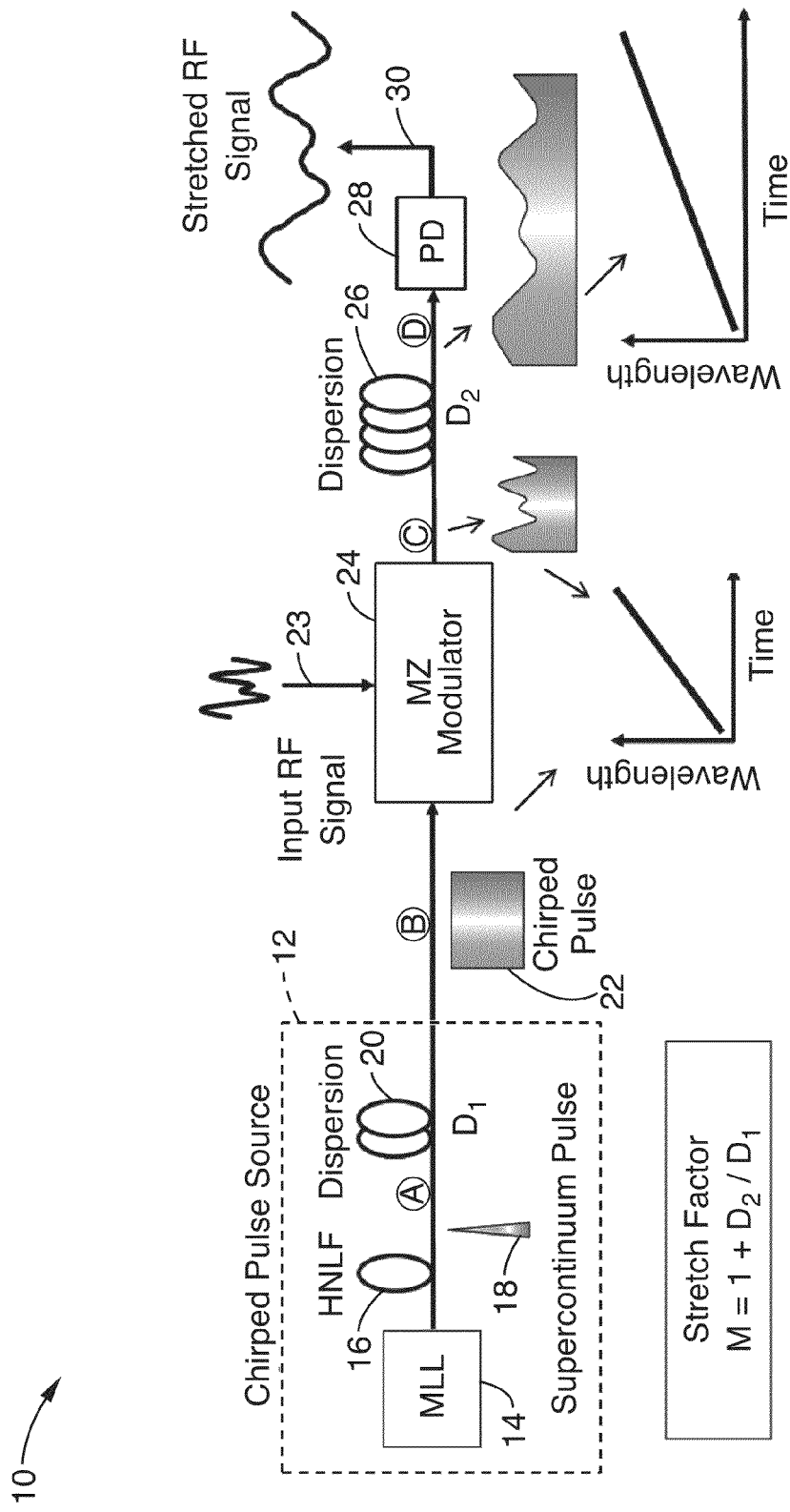
FIG. 1 is a block diagram of a photonic time-stretch pre-processor showing stretching of an input RF source.
Figure 2:
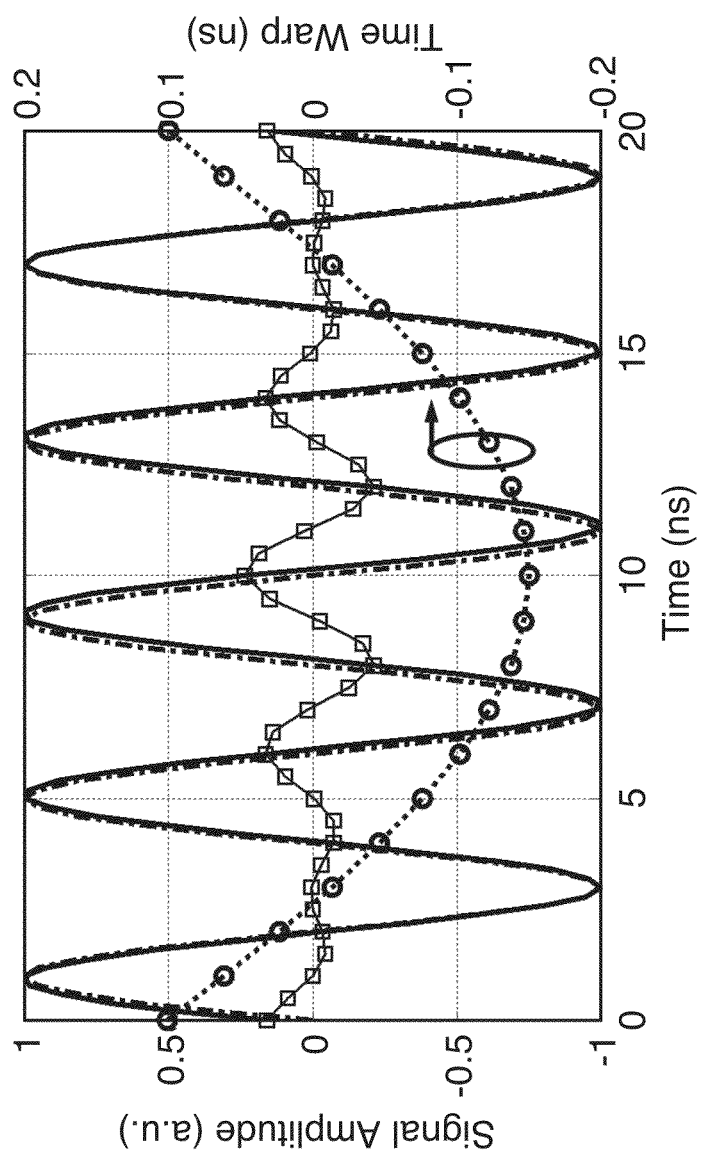
FIG. 2 is a graph of signal waveforms for the time-stretcher pre-processor of FIG. 1, showing induced time-warping.
Figure 3:
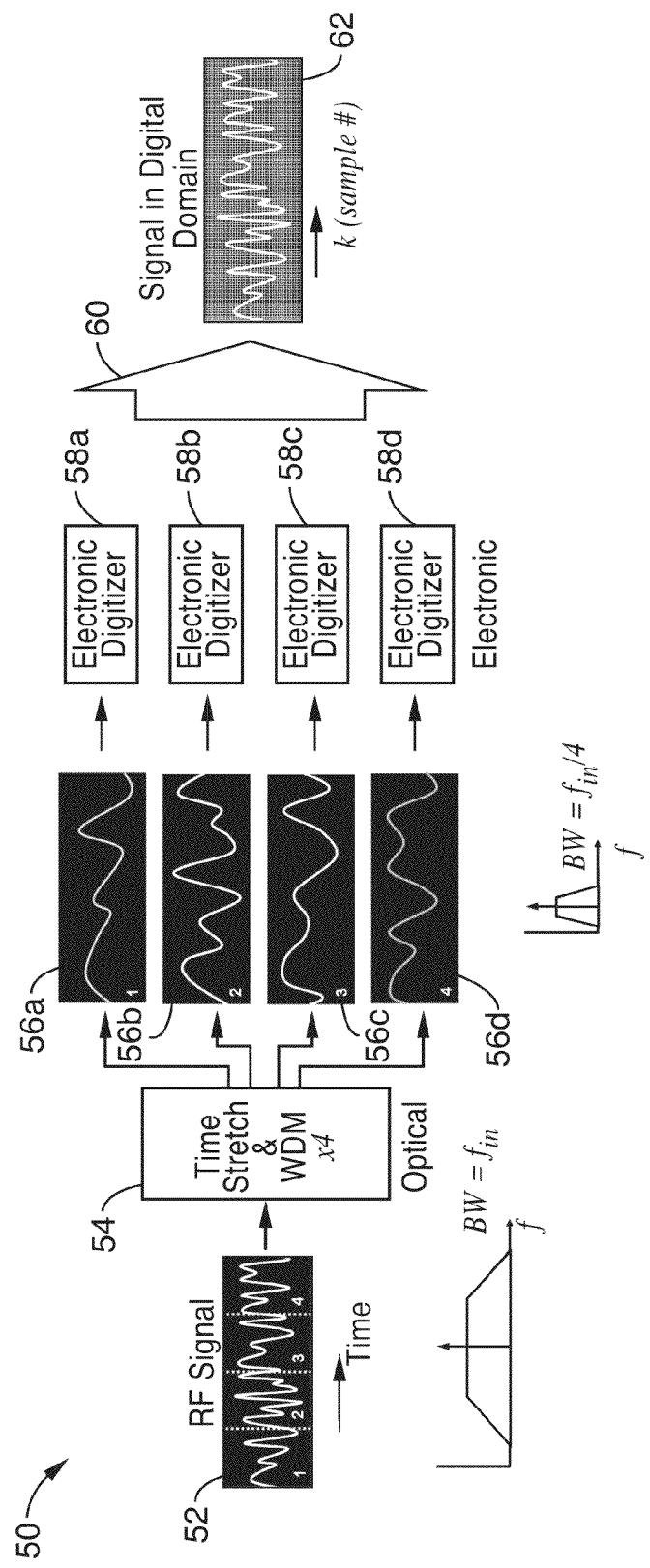
FIG. 3 is a block diagram of segmenting the stretched RF signal using wavelength division multiplexing (WDM).
Figure 4:
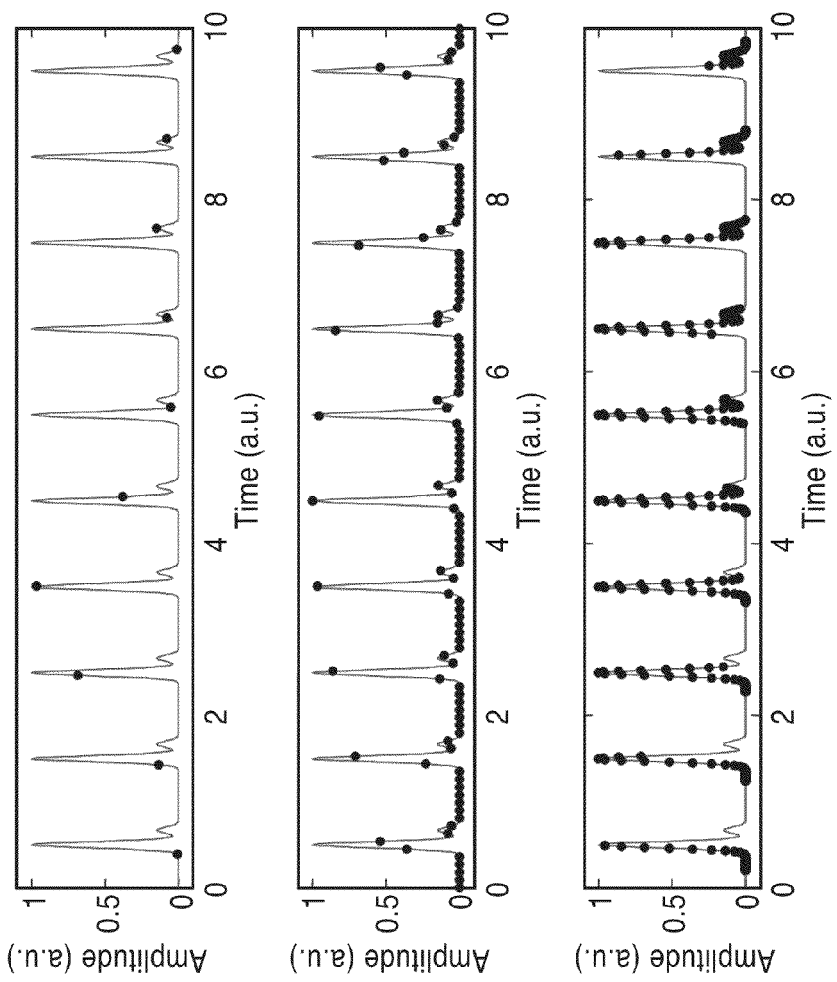
FIG. 4A-4C are graphs of RF signal sampling showing a comparison between existing sample techniques (FIGS. 4A-4B) and a method according to an aspect of the present invention (FIG. 4C).

Referring more specifically to the drawings, for illustrative purposes the present invention is embodied in the apparatus generally shown in FIG. 4A through FIG. 24. It will be appreciated that the apparatus may vary as to configuration and as to details of the parts, and that the method may vary as to the specific steps and sequence, without departing from the basic concepts as disclosed herein.

1. INTRODUCTION TO TISER OSCILLOSCOPE CONCEPTS

An electrical signal measuring instrument (e.g., digitizer or oscilloscope) is described which uses a TS-ADC in a single channel configuration called Time Stretch Enhanced Recording (TiSER). By way of example this apparatus is exemplified within a TiSER based oscilliscope providing a burst form of single channel waveform capture.

FIG. 4A-4C illustrate a comparison of existing sampling techniques (FIG. 4A-4B) with that of the present invention (FIG. 4C). FIG. 4A depicts sampling as performed by an equivalent-time oscilliscope (scope) which samples at a very slow rate and can only reproduce signals of a repetitive nature. Thus, the equivalent time scope samples the signal at very slow rates, then arranges the samples in equivalent time to reproduce the original data. The process is similar to that of using a strobe light for showing changes with respect to time, but cannot operate in real-time and it can only show changes which repeat over a long period of time. FIG. 4B depicts sampling by a real-time digitizer which samples continuously, yet due to its limited bandwidth it is unable to fully capture this fast signal.

The inventive TiSER scope apparatus performs sampling in FIG. 4C at very high bandwidth in real-time during segments of the waveform, and can quickly reproduce the waveforms on equivalent time scales. The TiSER scope performs real-time burst sampling (RBS), capturing ultra-wide bandwidth signal segments in real-time, and reproducing long term repetitive behavior on an equivalent-time scale. Therefore, it can capture both fast repetitive signals and their short-term transient behavior. It should be appreciated that optical medium can provide multiple orders of magnitude time stretch factors (e.g., stretching of up to approximately 250 times) allowing various modes of this system to operate with currently available ADCs on input signals up to approximately 100 GHz.

Burst mode sampling, enabled by the single channel TS-ADC, offers ultra-fast real-time sampling during short segments, and thus far exceeds the sampling rate of conventional real-time digitizers. Yet, similar to sampling (equivalent-time) scopes, it is capable of capturing long-term signal behavior. It should be appreciated that existing sampling scopes have no real-time capability, in contrast to the inventive TiSER apparatus which offers real-time sampling during short segments of time. During digital data capture, these segments span several bit intervals so the TiSER is able to capture fast transients that would have otherwise been entirely missed by a sampling scope as it lacks real-time capability.

TiSER allows extraction of useful information from clock synchronous signals such as high speed serial data. Consequently, utilizing the inventive method, an oscilloscope (electrical signal measuring instrument) can be implemented having both wide bandwidth and providing the capability of measuring ultra-fast transient information in the captured signals, which is beyond the capability of existing electrical signal measurement instruments.

Real-time burst sampling (RBS), according to the invention, uses equivalent time operation of the TS-ADC. In contrast to a sampling scope, which captures only a single sample in one shot, this instrument, called the Time Stretch Enhanced Recording Oscilloscope or TiSER, asynchronously records real-time snapshots of the signal segments, each spanning several samples. It then displays them on an equivalent time scale, after proper synchronization and timing is performed in software.

FIG. 5 depicts Real-time Burst Sampling (RBS) offered by the TiSER and shown by the black dots in boxed time segments of waveform 62. Equivalent-time sampling shown by grey dots in waveform 62 misses such events as seen in equivalent-time sampling output waveform 64. By contrast, the TiSER scope captures these fast transients as seen in the TiSER output waveform 66. Since each capture sequence for the TiSER comprises an entire segment in real-time (not just sparse points), ultrafast non-repetitive dynamics can be recorded which occur within the segment periods shown by the three boxes depicted in the figure. It should be appreciated that such fast events cannot be observed by a sampling scope because it has no real-time capability, or by a real time digitizer because of its limited bandwidth. Therefore, it can be seen that the TiSER oscilloscope capabilities allow it to fill the performance and functional gap between sampling scopes and real-time digitizers.

2. DETAILED DESCRIPTION OF THE TISER OSCILLOSCOPE

The present invention discloses the method and apparatus for using photonic TS-ADC in a mode in which a single wavelength channel is sufficient for extracting useful information about an input signal. This information includes, but is not limited to, short-term transients and long term repetitive behavior. Since multiple parallel channels are not used in this mode of operation, the signal is not captured at all times (continuously), but conversely, segments of the signal are captured at repetitive intervals. In terms of reduction to practice, the system is far simpler, more compact, and can be manufactured at lower cost than a continuous-time multiple channel TS-ADCs. While all the information contained in the signal cannot be recovered, the system provides a new type of sampling, referred to herein as Real-time Burst Sampling (RBS).

RBS provides significant amounts of useful information about the signal and enables dramatic reduction in the time required to test and characterize the behavior of communication channels and components, for example when utilized for Bit Error Rate (BER) testing. By way of example and not limitation, the TiSER scope can be utilized for obtaining critical signal information (e.g., transients, switching behavior) about next generation high-speed communications systems, such as 100G Ethernet local area networks and long haul, transport, and other fiber optic links which are expected to form the backbone of an internet operating at 100-Gbps data rates, or higher. Fast networks, such as these, are expected to use advanced modulation formats which require the receivers operating in the link, and the instruments used to develop and characterize these links, to have high resolution ADCs which provide at least 20-GHz bandwidth.

The TiSER scope represents a new type of instrument for development of such links and for their testing and characterization during research, manufacturing and/or their deployment phases. In addition to characterizing the performance of demodulation, the TiSER apparatus is uniquely able to provide real-time information about Inter Symbol Interference (ISI) for random data. This information is needed for digital correction of data impairment using equalization and other post-processing techniques. The information about the data provided by TiSER can also be utilized for enabling other beneficial functions, such as data clock recovery, optical carrier phase recovery, and similar operations which require high-bandwidth and accuracy. In addition to optical fiber networks and links, the TiSER oscilloscope can be very useful for characterizing emerging high-speed serial data links such as USB 3.0 (which targets 5-Gbit/s serial data rates), PCI-Express that can have data rates up to 12.5-Gbit/s, OC-768 having data rates up to 43 Gbits/s, and Ethernet OTU4 having data rates up to 100-Gbits/s.

3. PROOF OF CONCEPT DEMONSTRATION

The inventive TiSER was tested as a proof of concept using real-time burst sampling (RBS) to capture 40-Gbps PRBS (pseudo-random bit sequence) data signal. This signal was intentionally corrupted by inter-symbol interference (ISI) using a coaxial cable with bandwidth less than that required to transmit the data. This test configuration emulates the impact of what is referred to as 'dispersion penalty', the fundamental impairment suffered by high speed data as it travels through a long span of optical fiber. As a result of the corruption, the data eye captured by the TiSER scope had poorly defined openings.

FIG. 6A-6B illustrate eye diagrams resulting from capturing of the 40-Gbps pseudo-random serial data by the TiSER scope. FIG. 6A depicts the eye diagram before equalization, while FIG. 6B is an eye diagram shown after application of a linear four-tap feed forward equalizer in the digital domain which can be seen to significantly improve data eye results.

Using real-time bursts of data captured by the TiSER, the nature and extent of ISI was characterized and post processing performed to improve the quality of the data (eye opening) leading to improvements in the fidelity of the received data. More specifically, with a linear four-tap feed forward equalizer, the data eye opening could be significantly improved, as was seen in FIG. 6B. The inventors are unaware at this time of any practical systems which can digitize signals and achieve functionality at these speeds.

In general, eye diagrams provide vital information about signal integrity in a serial data communication link. Jitter, measured as fluctuations in zero-crossing points in the eye diagram, indicate channel response and transmitter characteristics. Measurement of jitter for long pseudo-random data patterns is required for ensuring better than $10^{-12}$ BERs (bit error rates). Eye diagram measurements performed using BER test scopes can currently require more than a day to scan the data eye completely. Even when the jitter is analyzed statistically, the observation time can be long (since all captured points do not lie close to the zero crossings. On the other hand, each segment from the TiSER has a continuous run of samples. As a result, time points for all zero crossings occurring within one segment can be obtained using interpolation between segments, improving jitter histogram acquisition speeds by multiple (e.g., three to four) orders of magnitude. Additionally, with RBS, fluctuations occurring over very short time intervals, such as short time jitters, can be readily analyzed.

The TiSER scope can also be useful in capturing rare events and their dynamics in high data rate communications. It should be recognized that FIG. 5 showed a hypothetical data stream with rare spikes. As a consequence of capturing data in real time within a time segment by TiSER, there is a substantial probability of capturing such rare events, which is not possible with sampling scopes because of their limited sample rates. Real-time digitizers are similarly unable to solve this problem, as they provide limited bandwidths which are unable to capture fast event dynamics.

FIG. 7 illustrates an experimental embodiment 70 for testing PRBS data corrupted by transient (stochastic rogue phenomenon) events as captured by the TiSER scope. In this demonstration, optical rogue waves are generated and added to the pseudo-random binary sequence (PRBS) electronic data at 12 Gbps. By way of example and not limitation, a source of optical rogue waves 72 can be directed upon a photo detector 74 (PD) through which PRBS data 80 is coupled. A modulator 78 receives a chirped optical source signal 76, as well as data 80 with the rogue interference from source 72. Output from modulator 78 is directed through a dispersive fiber 82 and detected by PD 84 coupled to digitizer 86. The combination of signals is modulated onto chirped optical carrier pulses, which are time-stretched in the dispersive fiber. At the receiver, these stretched waveforms are captured by an ADC, such as in this example having 5 Gsps (giga-samples per second) and a 4 GHz input bandwidth. Without time-stretched pre-processing, the bandwidth of the ADC would have been insufficient to capture the 12 Gbit/s data.

FIGS. 8A and 8B depict capturing of the rogue event by the TiSER scope in a 400 μs interval in FIG. 8A, and as captured by a sampling oscilloscope over the 400 μs interval in FIG. 8B. In comparing the two images, it will be noted that the TiSER in FIG. 8A produces a clear eye diagram in addition to properly capturing the rare (rogue) transients. One such transient that occurred during data transmission is shown highlighted with sample position dots along its length to highlight it. For comparison, FIG. 8B represents the waveform that would be collected by a conventional sampling scope, which does not benefit from time-stretching as taught by the present invention and thus provides an insufficient number of samples to properly display the eye diagram or to capture the rare rogue event.

In addition to these applications, there are several other advantages of using the TiSER scope. Very high sensitivity can be achieved using TiSER scope for purely repetitive waveforms in response to averaging. For example, in automatic test equipment employing Time-Domain Reflectometry (TDR), repetitive waveforms are generated by a source on a medium and the reflected waveforms are averaged over multiple scans toward significantly improving sensitivity or significantly reducing the test time for a given sensitivity value. Even single-shot TDR measurements can be performed (assuming proper synchronization), and performed in an extremely rapid manner when the reflected pulses have short time apertures and the required sensitivity is not too high.

From a device reliability perspective, high voltage spikes can damage the front ends of conventional sampling oscilloscopes by destroying or damaging sensitive electronic circuitry, such as amplifiers. On the other hand, since the front-end of the TiSER scope is a modulator, such as preferably $LiNbO_3$ (Lithium Niobate), significantly higher voltages (e.g., ~1000 Volts) can be tolerated without damaging the front-end.

In a related aspect of the invention the modulator (shown as block 78 in FIG. 7) can be housed separately from the digitizing apparatus (e.g., pulsed optical source, optical detector and analog to digital converter), such as for applications which may be exposed to adverse environmental factors, high levels of EMI, EMI pulses and so forth. This embodiment allows the remainder of the TiSER scope to be retained in a shielded housing, or otherway protected at a distance from where the RF signal source enters the modulator. By way of example, the modulator may be connected through two optical fibers up to 100 km in length.

In conventional digitizers, the noise contribution from jitter in the sampling clock can become a dominant component of the measured noise or jitter. It should be recognized that this noise increases rapidly with signal frequency and clock jitter. It should be appreciated, however, that slowing down the signals can significantly reduce these effects, rendering TiSER very useful in jitter-sensitive applications. For example, the advantages of time-stretching in this regard have enabled the capture of 10-GHz bandwidth signals at an unprecedented 7.2 effective bits of resolution.

The benefits provided by the TiSER scope according to the present invention could lead to its use as a universal piece of test equipment that may be applied to a wide range of applications involving the testing and measurement of high speed electrical signals. In addition to wideband real-time burst sampling capability, the TiSER scope can also significantly improve the measurement sensitivity and speed in instruments.

4. TECHNICAL DETAILS OF TISER IMPLEMENTATION

The TiSER scope includes a time stretch pre-processor and a real-time electronic digitizer at the backend. Each segment of the input waveform is captured by a chirped optical pulse (generated by a mode-locked laser). For $n^{th}$ laser pulse, the signal recorded at absolute time instant t (by the backend digitizer) is displayed on time axis of the scope window at the time point $$t_{out} = \left(nT_{laser} + \frac{t - nT_{laser}}{M}\right) \text{modulo } T_{trigger} \quad (1)$$

wherein "modulo" is the arithmatic modulo operation that returns the remainder with $t_{out}$ divided by $T_{trigger}$ while $T_{laser}$ is the pulse repetition period of the laser. Value $T_{trigger}$ is the period of the trigger signal (eye diagram time window) that is synchronous with the signal to be captured, and M is the stretch factor. The expression in the braces of Eq. 1 converts the time scale of the captured (stretched) signal segments to an original signal time scale (division by M is for unstretching the segments). The modulo operation generates the eye diagram by chopping and overlaying these time segments. The trigger signal is preferably externally provided as is the case with the majority of sampling oscilloscopes. The trigger and the laser periods can be obtained in software from the captured pulses and the trigger clock using digital phase locking. Hence, the TiSER does not need to satisfy any additional condition to capture the signal when compared to a sampling oscilloscope.

Figure 9:
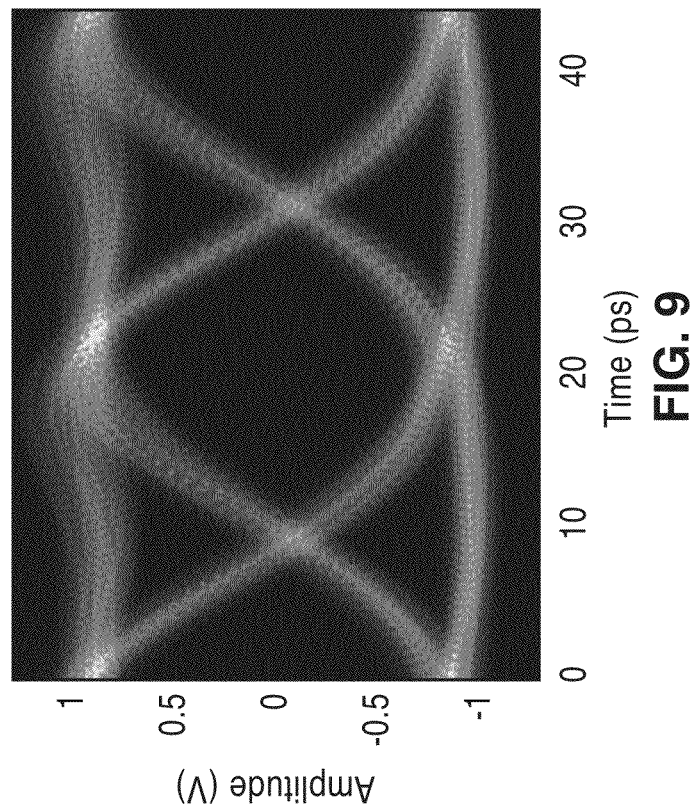
FIG. 9 is a waveform image for 45-Gbps PRBS data captured using the TiSER scope with a stretch factor of 34, according to an aspect of the present invention.

FIG. 9 depicts an eye diagram of 45-Gbps PRBS data captured in 10 µs using a TiSER scope according to the invention having a stretch factor of 34. The bandwidth of the backend digitizer in this case was limited to 1.5 GHz (i.e., 3-GS/s Nyquist sampling rate) to demonstrate the ability of the front end time stretch pre-processor of the TiSER to extend the bandwidth of a backend digitizer. By way of example, data was generated by Anritsu pattern generator MU181020A. Therefore, time-stretching increased the effective analog bandwidth to 50-GHz and the Nyquist sampling rate to 100-GS/s, respectively. The segment length, given by the length of the chirped optical pulse that captures the analog signal was 0.6-ns. As a result, every captured segment consisted of 60 independent samples, which repeated at a 37-MHz rate (pulse repetition period of the laser). Accordingly, the example system has a sample collection rate of 60×37-MHz=2.2-GS/s. Compared with this, the sampling rate achieved by the fastest commercially available equivalent-time oscilloscope is only 10-MS/s, whereby the present TiSER invention provides a sampling rate which is about 220 times faster than present equivalent-time oscilliscopes.

Figure 10:
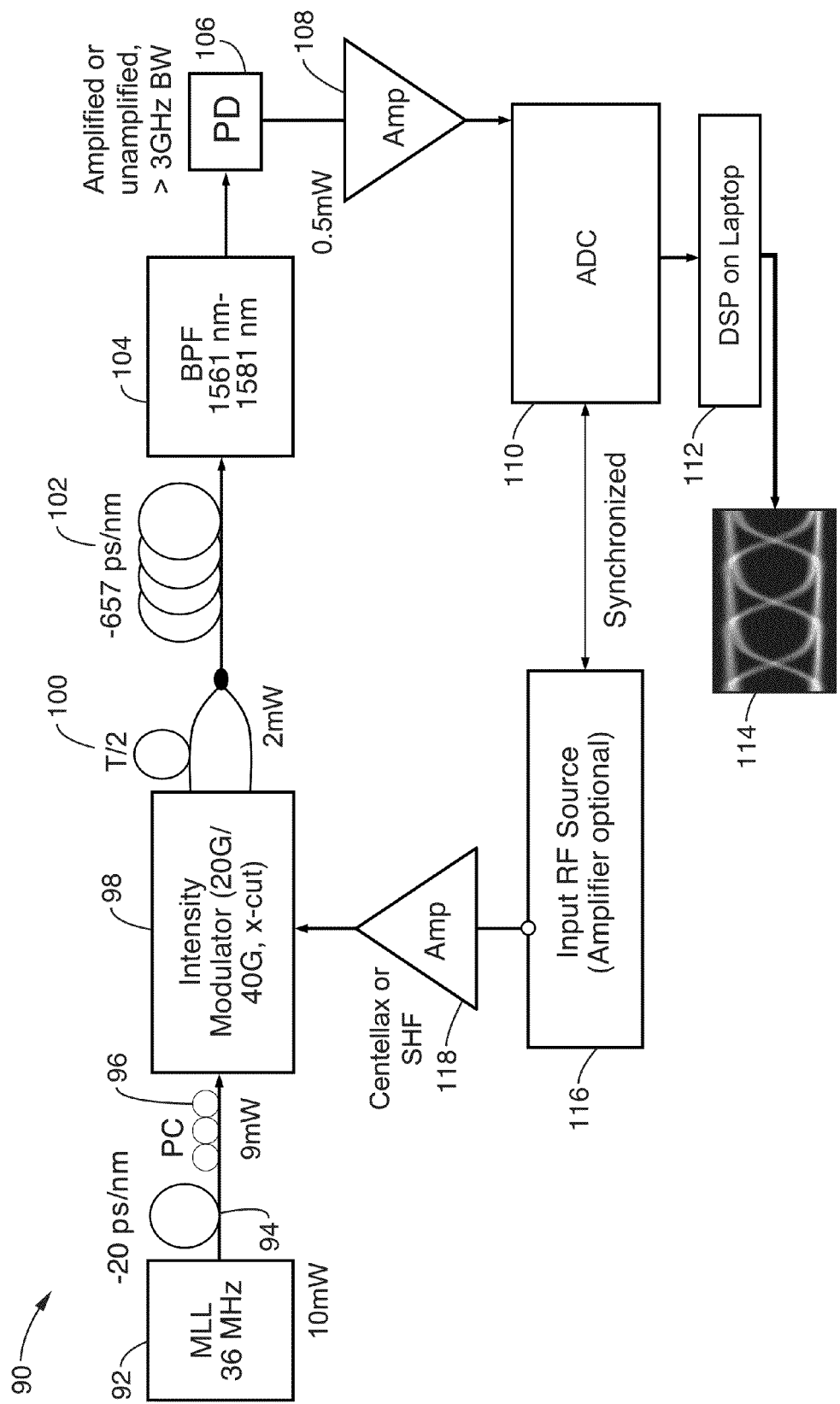
FIG. 10 is a block diagram of a TiSER scope embodiment according to an aspect of the present invention.

FIG. 10 illustrates an example embodiment 90 for performing testing with an analog or digital input. For generating an eye-diagram 114, the RF Source 116 is shown as a random data generator, such as a Pseudo-Random Bit Stream (PRBS) source. A Mode-Locked-Laser (MLL) 92 is shown, such as operating at 36 MHz with 10 mW power. MLL output is directed through a dispersive fiber 94, such as having a −20 ps/nm time shift, and passes through a polarization controller (PC) 96.

Output from modulator 98 passes through fiber section 100 having dual outputs. It should be appreciated that a modulator having a single output is sufficient for practicing the invention, while the use of a dual output modulator 98 is preferred. The additional information provided by the $2^{nd}$ output can be utilized either for removing common mode noise and distortion from the output, or for eliminating the dispersion induced limitations in the bandwidth known as the dispersion penalty. The optical signal is dispersed through dispersion fiber section 102 and filtered through bandpass filter 104 (e.g., 1561-1581 nm) before detection by photodetector 106. Electrical output from PD 106 is amplified 108 and received by an ADC 110. Synchronization is provided by triggering the ADC 116 with the reference provided by the RF source or the PRBS source whichever is used. ADC 110 is coupled to a signal processing means 112, herein exemplified as Digital Signal Processing (DSP) performed on personal computer, (e.g., a laptop computer), which processes the signals to output waveforms 114. It should be appreciated, however, that signal processing according to the invention may performed by one or more general purpose and/or embedded processors for faster, ultimately real-time, data acquisition, processing and analysis.

Figure 11:
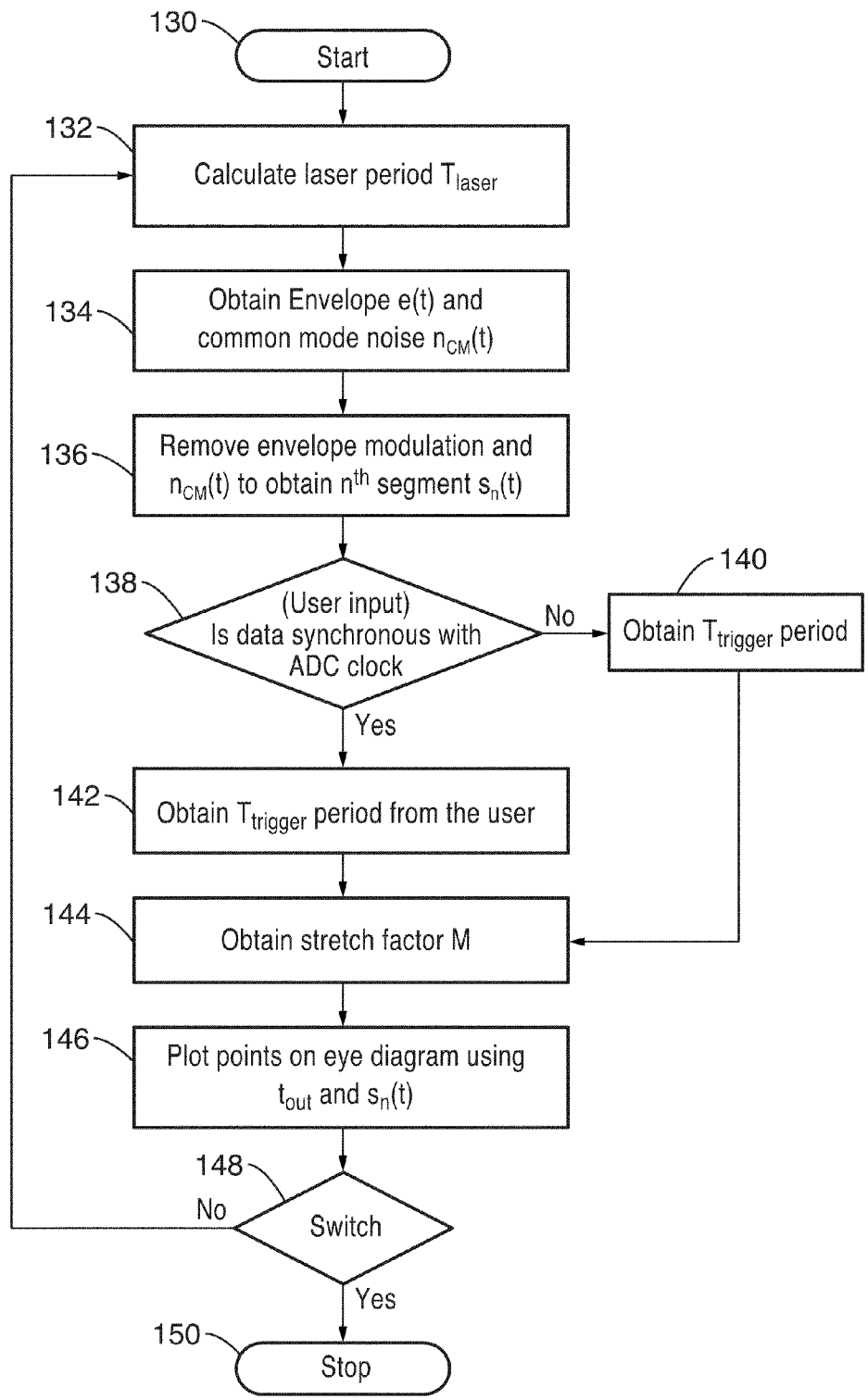
FIG. 11 is a flowchart of operating steps according to an aspect of the present invention for the TiSER scope shown in FIG. 10.
Figure 12:
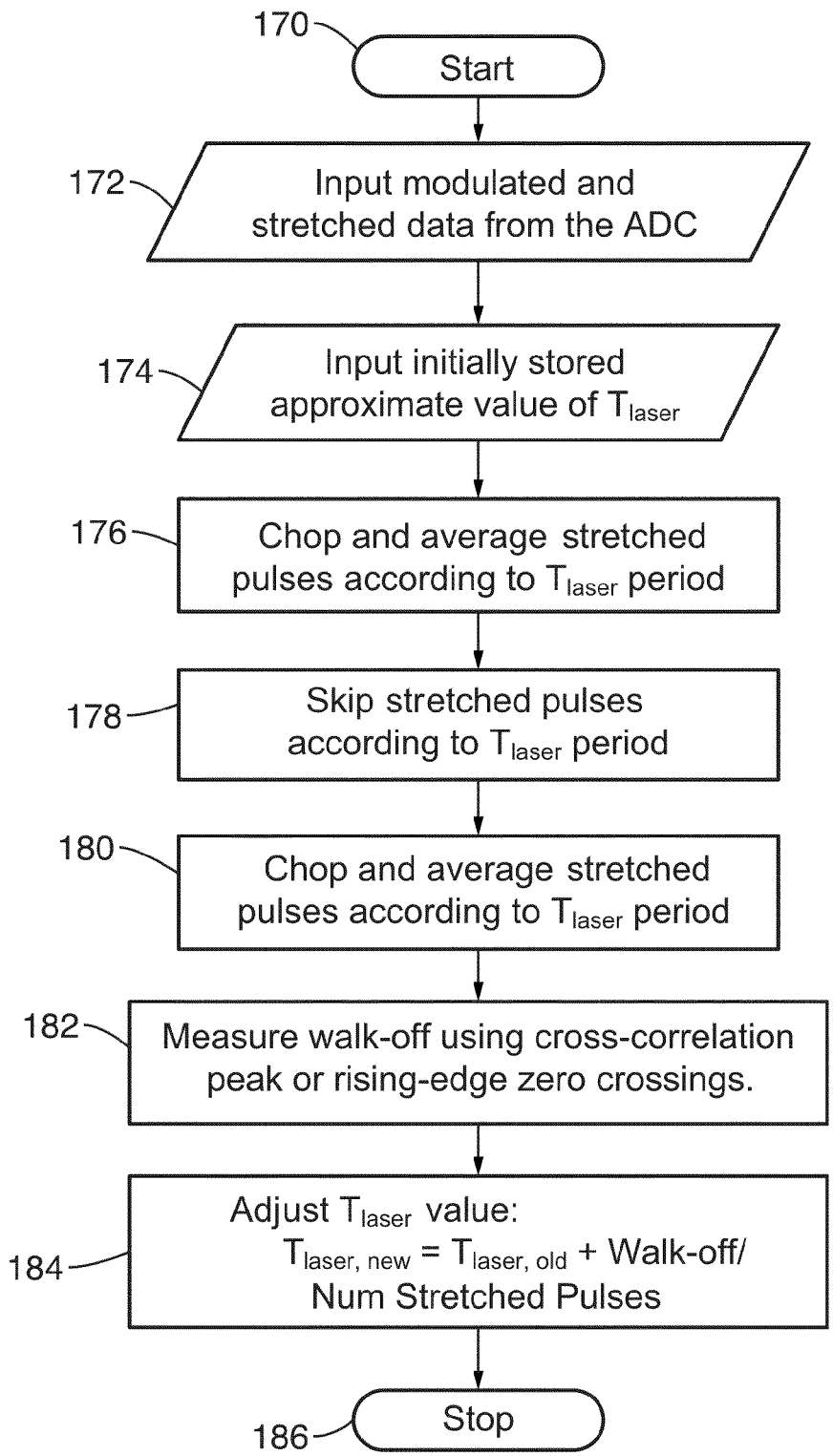
FIG. 12 is a flowchart for calculating laser repetition period for the TiSER scope according to an aspect of the present invention.
Figure 15:
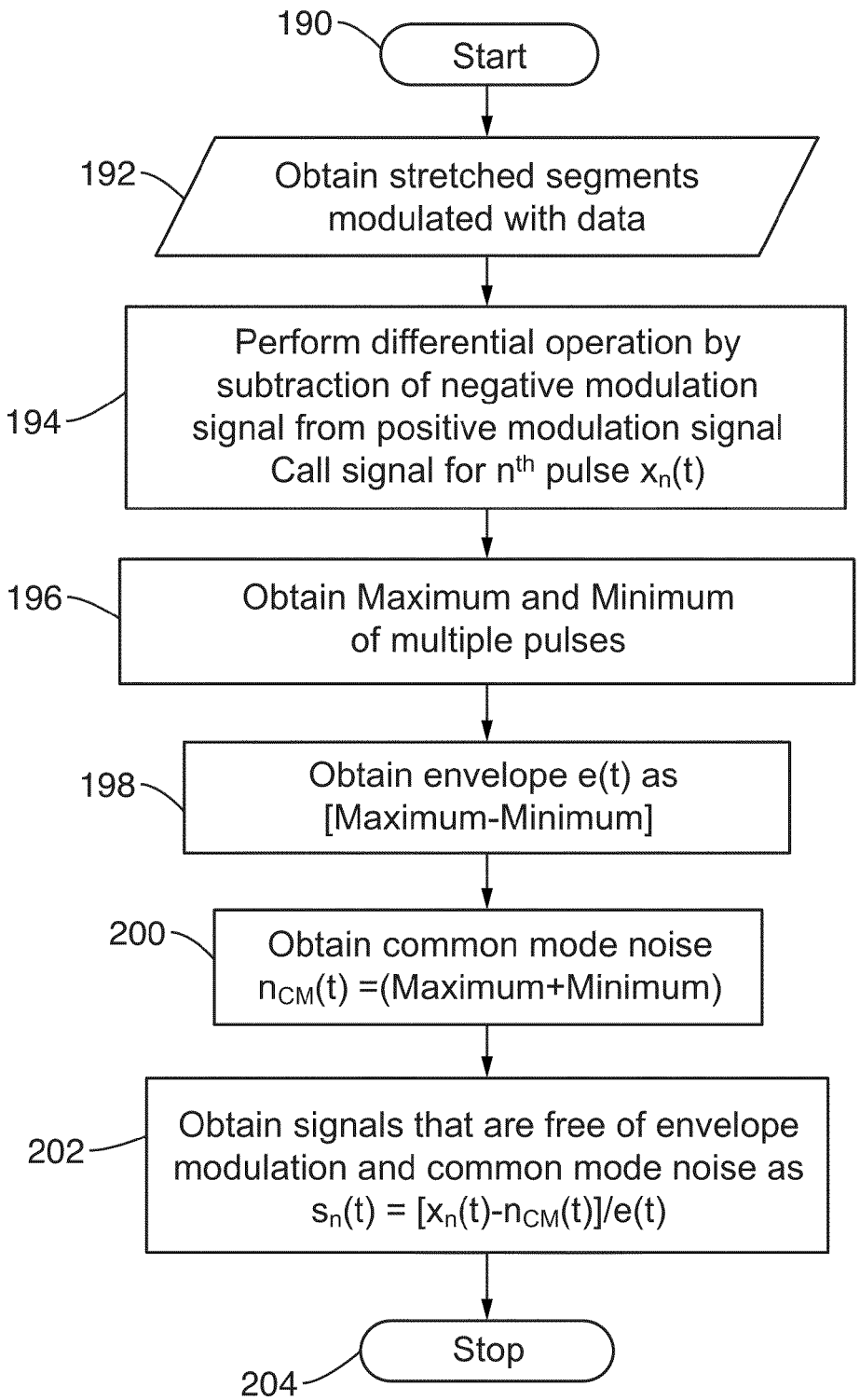
FIG. 15 is a flowchart of processing steps for removing the influence of laser pulse envelope according to an aspect of the present invention.

FIG. 11 illustrates processing according to an example embodiment of the present invention for plotting eye diagram for the digital data. Processing commences at step 130 and laser period $T_{laser}$ is determined in step 132 the details of which are shown in FIG. 12. The envelope e(t) and common mode noise $n_{CM}(t)$ are obtained at step 134 details of as well as for step 136 are shown in FIG. 15. In step 136 the envelope modulation e(t) and common mode noise $n_{CM}(t)$ is removed to obtain the $n^{th}$ segment $n_n(t)$, 202 in FIG. 15. In step 138 an input Yes or No is obtained from the user defined parameter list. Normally, the ADC 110 and the data source 116 are synchronized, in which case the input will be Yes. Then the user set bit rate is used to calculate $T_{trigger}$ as the reciprocal of the bit rate in Step 142. If the input is No in step 138, then the data period $T_{trigger}$ needs to be obtained in step 140. Stretch factor is obtained as per block 144, as described in FIG. 17. Eye diagrams are then plotted in step 146 by the programming in response to using to calculating $t_{out}$ as the input time variable, and $s_n(t)$ as the correct signal amplitude obtained in step 136 and Eq. 2. The horizontal size of the display window is the total time span and is equal to $N \times T_{Trigger}$, with N being a user-chosen time window scale parameter. It will be appreciated that $t_{out}$ can be calculated according to Eq. 1, while $s_n(t)$ can be calculated in Equation (2) as follows:

$$s_n(t) = [x_n(t) - n_{CM}(t)]/e(t) \quad (2)$$

The next step 148 tells the system to either continue acquiring new data or to stop. If the switch is Off then the process in FIG. 11 repeats at step 132. If the switch is On, then processing stops.

FIG. 12 illustrates processing according to an example embodiment of the present invention for calculating laser repetition period $T_{laser}$. Processing commences at step 170 and in step 172 the raw digital data is obtained from the ADC. In step 174, the initially stored value of $T_{laser}$ is input. The pulses are chopped according to the $T_{laser}$ period and averaged in step 176. The data over several subsequent $T_{laser}$ periods is skipped in step 178. Again in step 180 the pulses are chopped and averaged. Walk-off is measured in step 182 using cross-correlation peak or rising-edge zero crossings. The $T_{laser}$ value is adjusted in step 184 according to the following:

$$T_{laser,new} = T_{laser,old} + (\text{Walk-off/Num\_Stretched\_Pulses})$$

and processing is complete as shown in step 186.

Figure 13:
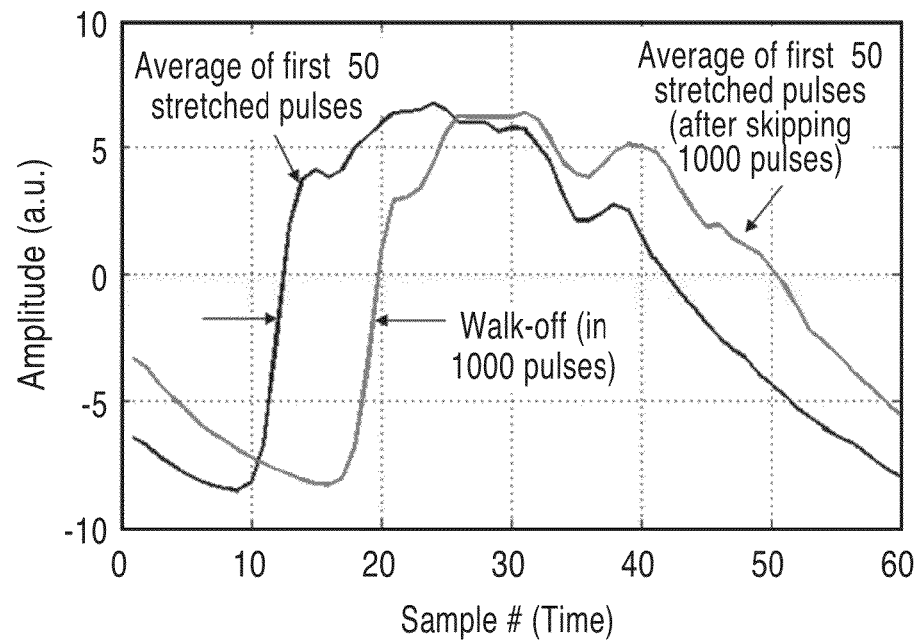
FIG. 13 is a graph of averaging stretched pulses before and after a delay, according to an aspect of the present invention.

FIG. 13 depicts one example of measuring walk-off amount with respect to time, based on an average over 50 stretched pulses after skipping of 1000 pulses, shown by way of example and not limitation. It should be recognized that the number of pulses used for averaging and the number used for the delay can be set as desired and/or suited to a given application.

Figure 14:
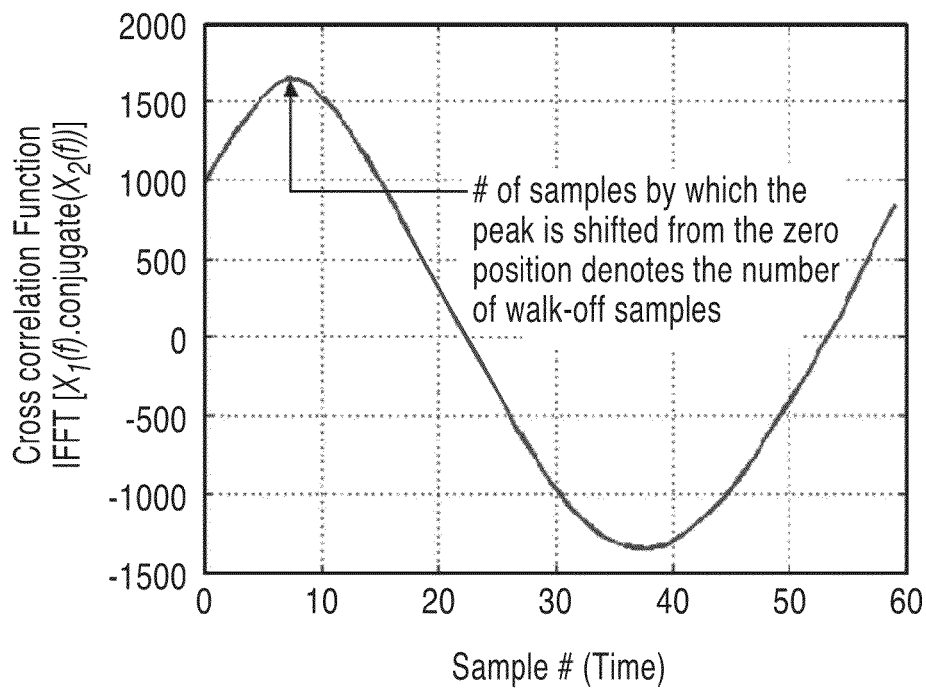
FIG. 14 is a graph of cross-correlation for determining walk-off according to an aspect of the present invention.

FIG. 14 depicts cross-correlation with respect to sample and shows the cross-correlation peak.

FIG. 15 illustrates an example embodiment of signal processing steps for removing the influence of laser pulse envelope from the data, which represents a type of common mode distortion. Processing commences at step 190 with data obtained from the ADC at step 192. A differential operation is performed in step 194, such as by subtracting the negative modulation signal from the positive modulation signal, obtained from the two outputs of the modulator 98, to yield $x_n$(t) for the $n^{th}$ pulse. In step 196 the maximum and minimum of multiple pulses are obtained, such as over 1000 pulses as per the example described in FIG. 16. In step 198 an envelope is obtained as e(t) as [Maximum−Minimum], after which common mode noise is obtained as $n_{CM}$(t)=(Maximum+ Minimum) in step 200. A corrected signal is then generated 202 which is free from envelope modulation and common mode noise in response to subtracting common mode noise from the differential signal and divided by the size of the envelope as previously described in relation to Eq. 2 and completing 204 the removal of mode noise and envelope modulation.

Figure 16:
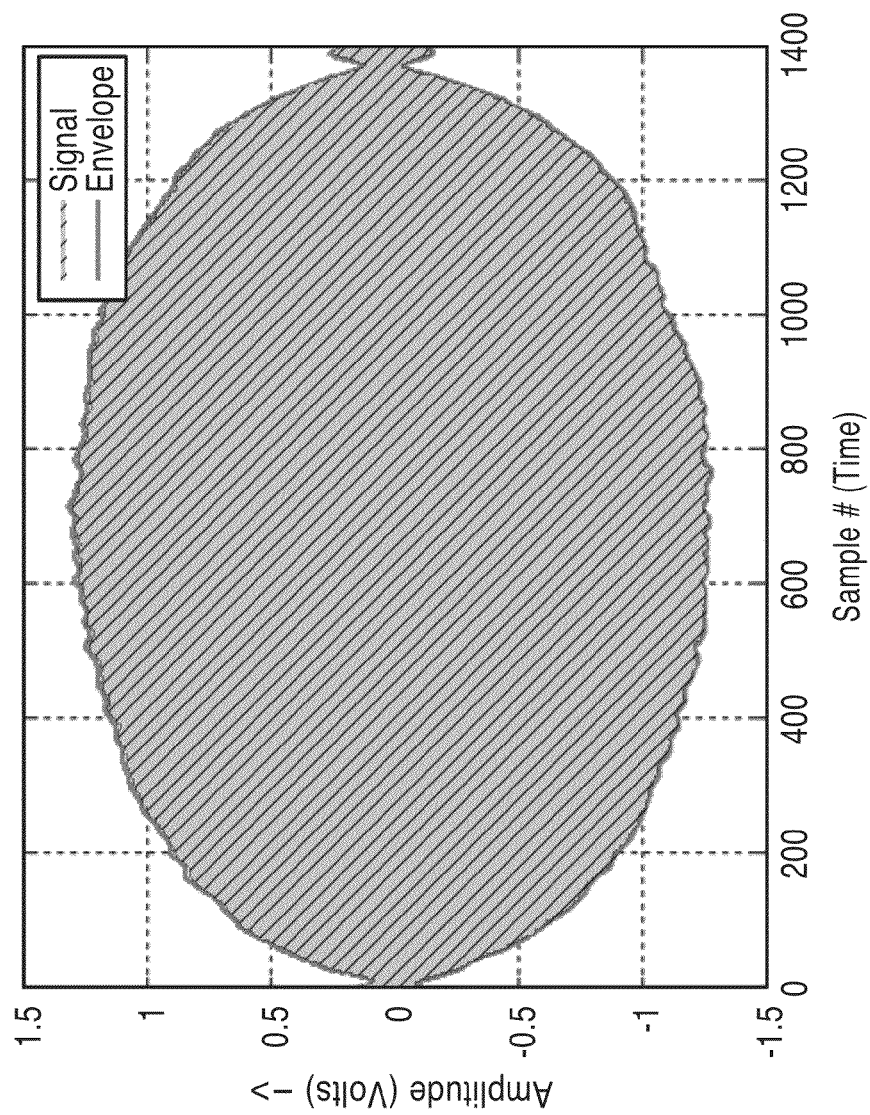
FIG. 16 is a graph of laser pulse signal and envelope over a span of samples as determined according to an aspect of the present invention.

FIG. 16 depicts laser pulse signal and envelope over a span of samples for the example test. It will be seen from the figure that the solid line representing the envelope surrounds the signal region.

Figure 17:
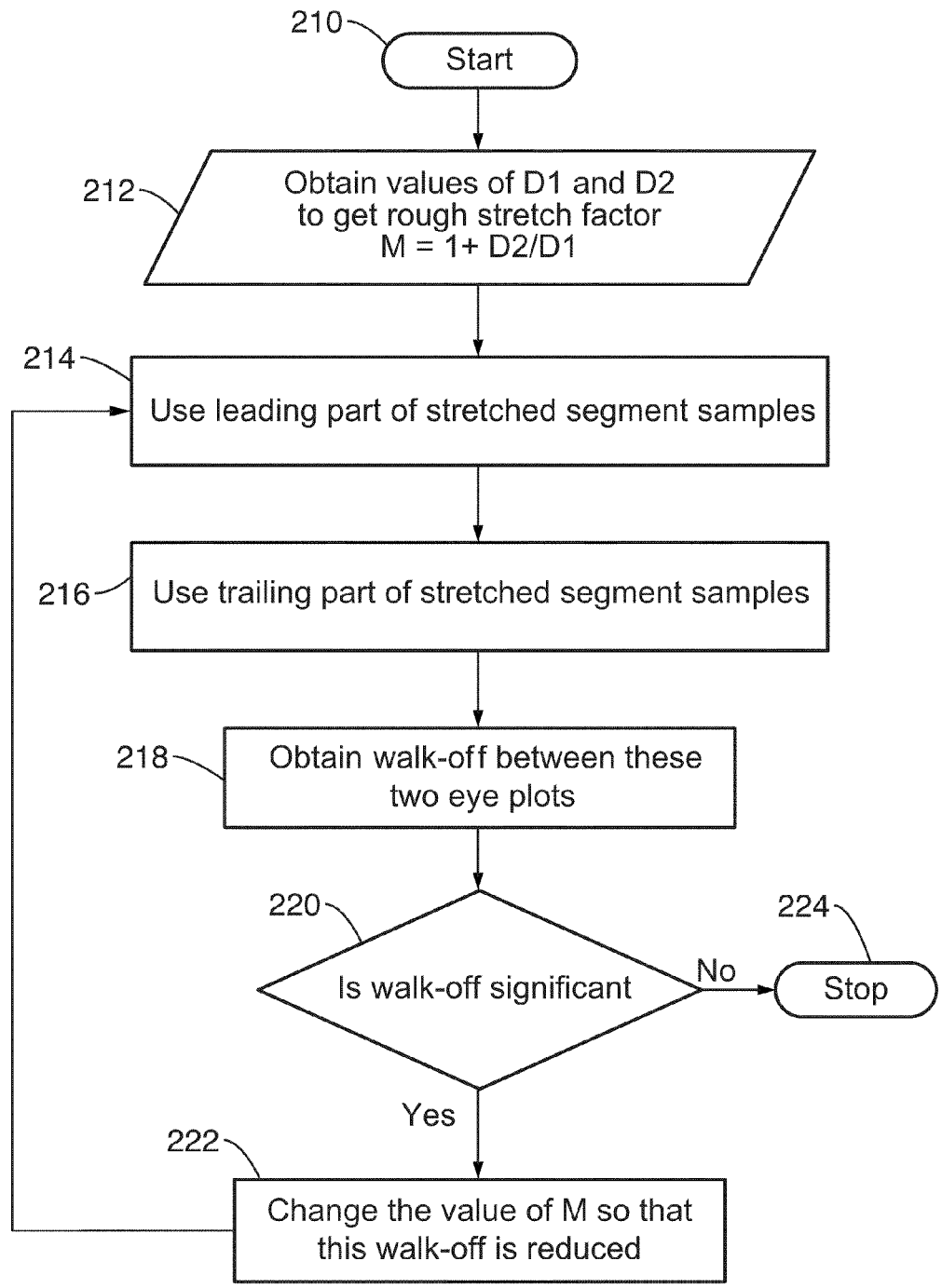
FIG. 17 is a flowchart of processing steps for determining an accurate stretch factor (M) value according to an aspect of the present invention.
Figure 18:
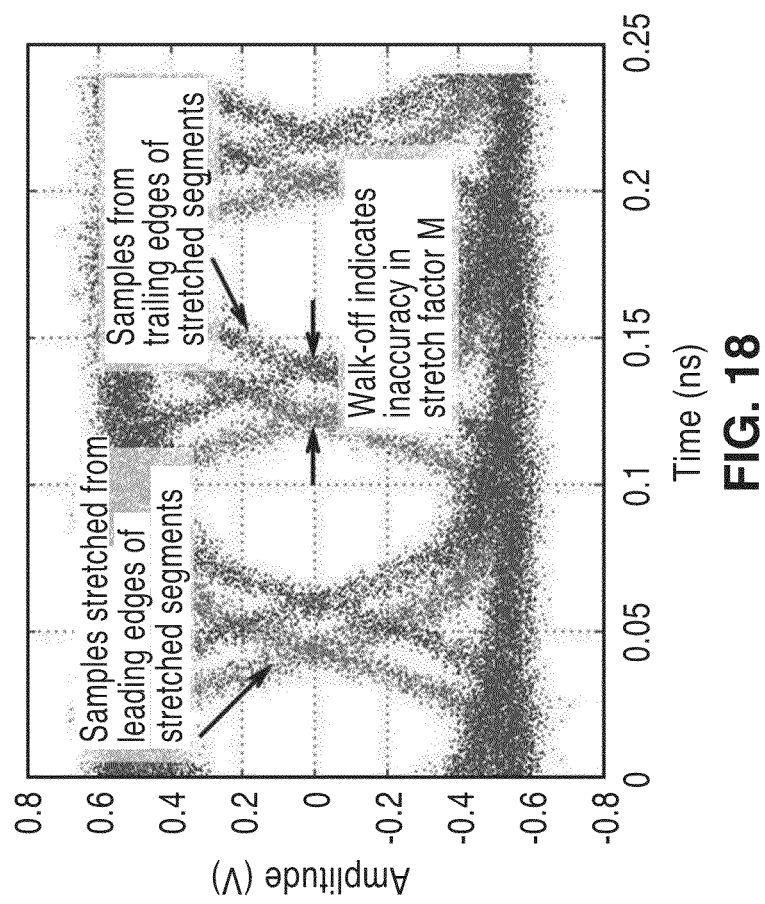
FIG. 18 is a waveform image illustrating inaccuracy in stretch factor according to an aspect of the present invention.

FIG. 17 and FIG. 18 illustrate an example embodiment of signal processing steps for accurately determining stretch factor (M), based on associated eye plot data. Stretch factor should be known for accurately plotting eye diagrams or other data display formats. After commencing in step 210, a rough stretch factor is obtained as per step 212 by getting values for $D_1$ and $D_2$ and calculating $M=1+D_2/D_1$ to obtain a rough stretch factor value. The leading part of the stretched sample segments is used in step 214 and then the trailing edges are used in step 216. Walk-off is then obtained between the two eye plots as shown in step 218 and FIG. 18. If the amount of walk-off is not significant, as detected at step 220, then processing stops at 224. Yet, if the walk-off is significant, then the value of (M) is changed in step 222 so that walk-off is reduced.

5. CORRECTION OF SIGNAL DISTORTION

The following describes methods and apparatus for recovering signals and removing distortion in a Photonic Time Stretched Analog-to-Digital Converter (TS-ADC). It should be appreciated that although these techniques are particularly well-suited for use in the TiSER scope they are more generally applicable to any TS-ADC devices.

Non-uniform stretching across the optical spectrum adds time-warp distortion to the stretched signal. The channel-to-channel timing offsets in the multi-channel or continuous-mode TS-ADC also add the same effect, although in the form of a discontinuity.

Figure 19:
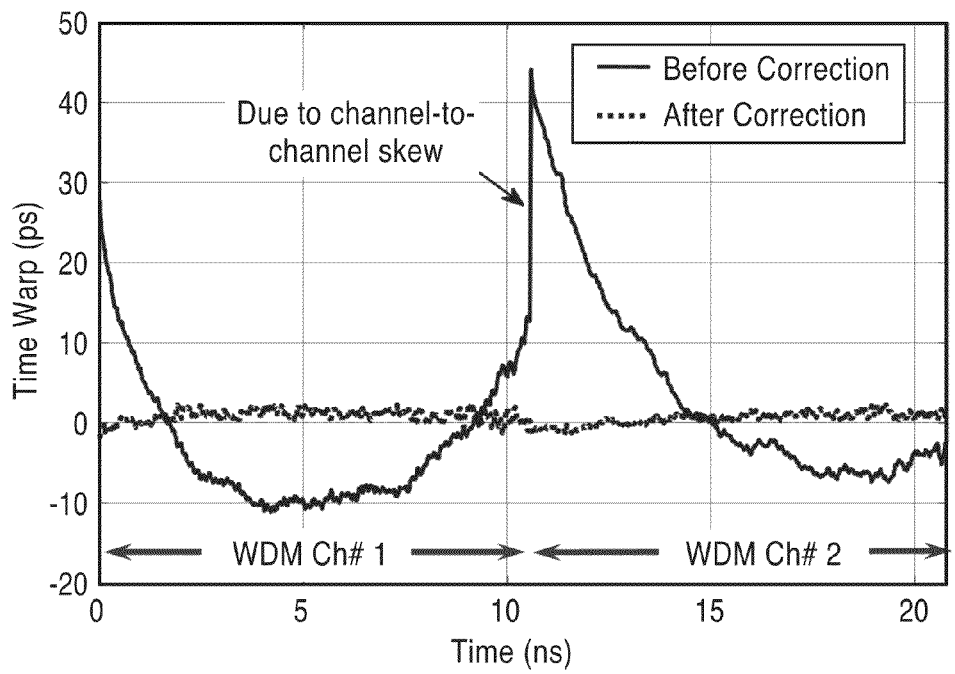
FIG. 19 is a graph of time-warp before and after correction according to an aspect of the present invention.

FIG. 19 depicts time-warp magnitude both before and after correction. Viewing the figure, it is seen that the solid line which exhibits significant peaking, depicts time-warp prior to correction, while the nearly flat dotted line depicts time-warp after correction. The graph is plotted along the time axis of two combined WDM Channels, with a sharp discontinuity being seen in the time-warp before correction which arises in response to timing offset between the two channels.

The time-warp has several origins that are primarily deterministic in nature (constant over time) and hence can be calibrated. To measure time-warp magnitude for the purpose of calibration, segments of a sinusoidal RF tone are stretched using several (e.g., a few hundred optical pulses) and captured by slow backend ADCs. The waveforms from adjacent parallel wavelength channels are coarsely aligned in time and concatenated. The data is then fitted to a sinusoidal (e.g., single frequency) harmonic function and the difference between the measured waveforms and zero crossings of ideal sine-fit curves, such as averaged over these waveforms, is then obtained. The sharp jump in the center shows timing error (skew) between adjacent WDM channels. The time-warp data plotted in the figure (FIG. 19) is preferably utilized for correcting the time-warp in unknown arbitrary signals by performing interpolation. Interpolation is used to convert the samples on a non-uniform time scale to a uniform time scale. Using interpolation, the sample amplitudes at a few adjacent time points can be used to calculate the sample value at a desired intermediate time point. Once the average time-warp data is obtained with the sampling time points, interpolation can easily be performed in real time using a dedicated digital signal processor which may comprise one or more computers and/or embedded processors.

6. REMOVAL OF WAVELENGTH DEPENDENT BIAS OFFSET DISTORTION

Figure 20:
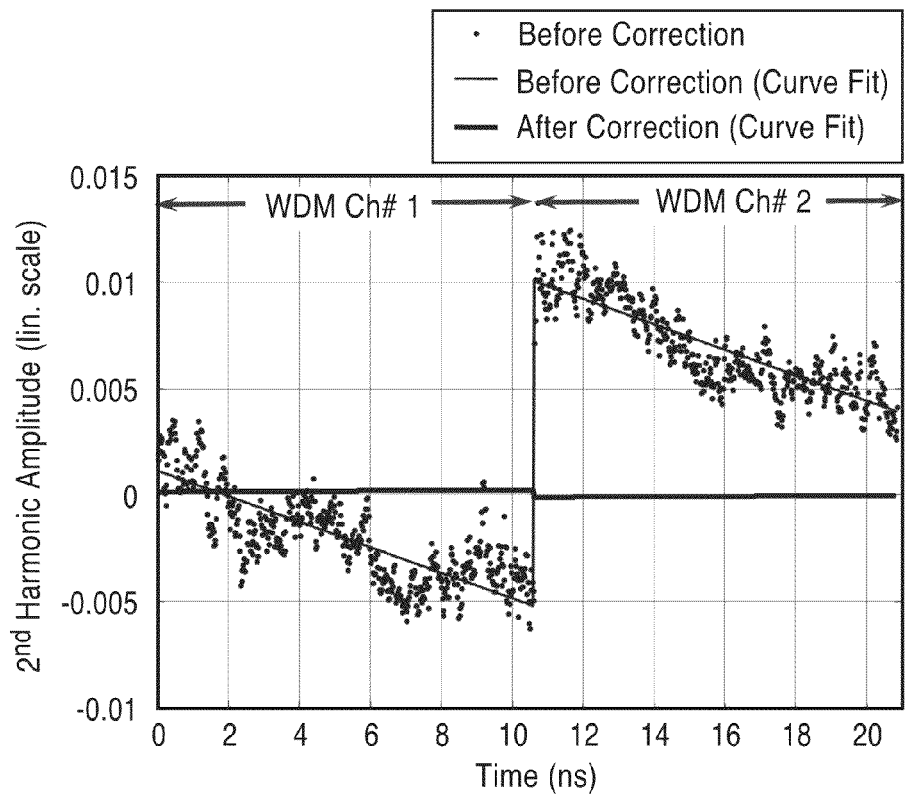
FIG. 20 is a graph of wavelength dependent bias offset shown before and after correction according to an aspect of the present invention.

FIG. 20 depicts measured second harmonic amplitude versus time due to wavelength dependent bias offsets in the Mach-Zehnder modulator. As seen from the graph, a narrow solid line is shown as the curve fit for a number of data points, while the wider solid line depicts distortion after correction. It should be appreciated that the correction provided by digital post processing almost entirely suppresses the distortion.

Even after correction of time-warp distortion, the signal still has a time-varying $2^{nd}$ harmonic distortion due to the wavelength dependent bias offset in the Mach-Zehner modulator (MZM). These offsets are caused by mismatches in the two arms of the MZM. This effect becomes significant for wide optical bandwidths and can be reduced, for example by performing an arcsine operation. While the amount of mismatch can be induced from the average signal value, this becomes difficult as there are other source offsets added by the electronics, and the $2^{nd}$ order non-linearity generates additional DC terms. To overcome these problems and correct for non-linearity due to MZM bias offsets, a similar harmonic fitting technique can be utilized as was used for time-warp correction. However, in this case, the amplitude of the $2^{nd}$ harmonic component for a given wavelength is proportional to the average quantity obtained by adding the timing offsets in zero crossings of positive edges and subtracting the timing offsets in zero crossings of the negative edges, when compared to an ideal sinusoid. As shown in FIG. 20 and as expected from the wavelength dependence of bias offset, it is found that $2^{nd}$ harmonic amplitude δ(t) varies linearly with the wavelength. Once δ(t) is measured, the linearized signal y(t) is obtained from the uncorrected signal x(t) as $$y(t)=x(t)-\delta(t)\cdot(2x^2(t)-1) \qquad (3)$$

For example, a harmonic RF signal, cos(ωt), with time dependent $2^{nd}$ harmonic amplitude given by δ(t), takes the form $x(t)=[\cos(\omega t)+\delta(t)\cdot\cos(2\omega t)]$. Equation (3) gives $y(t)=[\cos(\omega t)+2^{nd}$ order terms in $\delta(t)]$. Since $\delta(t)$ itself is small, the $\delta^2(t)$ terms become negligible and hence original signal $y(t) \approx \cos(\omega t)$ is obtained.

7. BROADBAND LINEARIZATION

As previously mentioned non-linear distortion added by dispersion effects, Mach-Zehnder modulator (MZM) transfer function and MZM wavelength dependent bias offsets are a dominant component of the distortion added to the signal during the time stretch process. This distortion can be significantly reduced using differential operation, arcsine correction and additional signal processing described in the previous section. It will be noted that the arcsine correction function is both static (memoryless) and frequency independent. However, residual non-linear distortion can still be present due to memory effects, such as when the non-linear distortion is dependent on signal frequency. The memory effect is predominantly due to dispersion characteristics in the optical link. Electronic amplifiers and photodetectors can also add significant memory effects when they are forced to operate in saturation.

Figure 21:
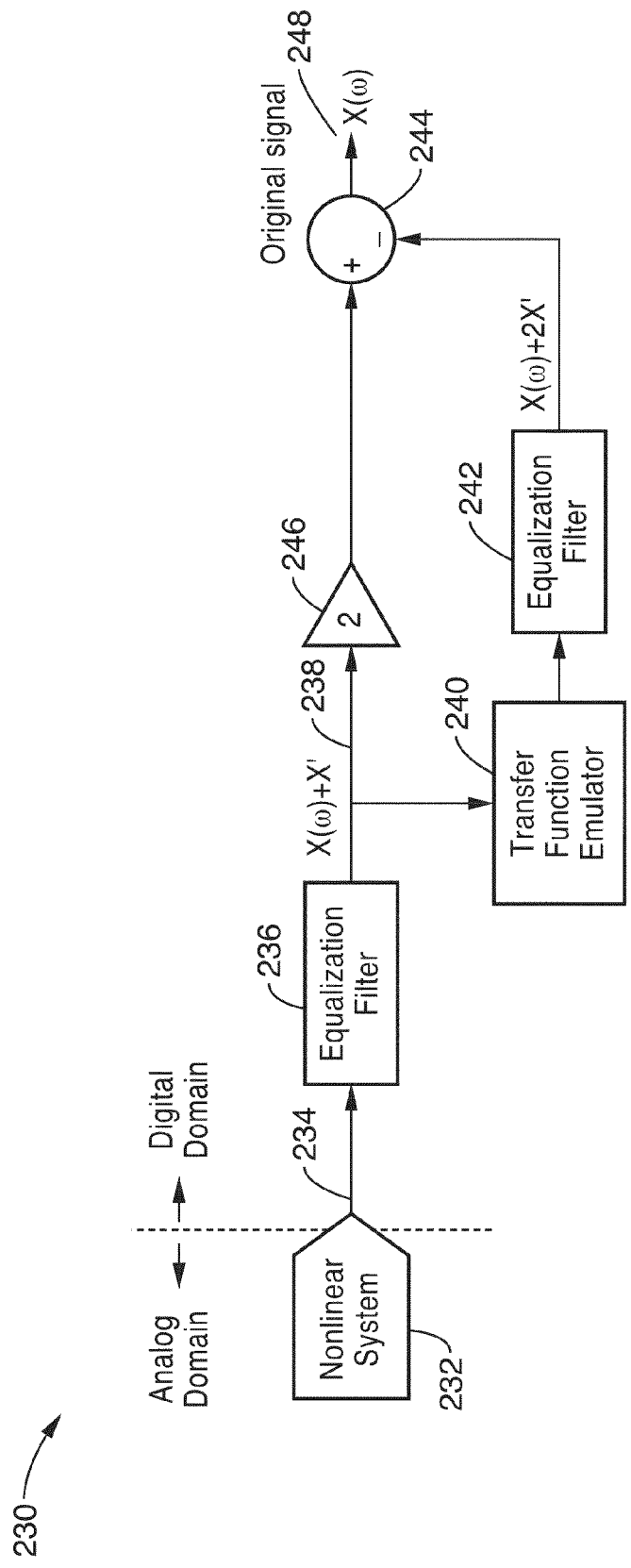
FIG. 21 is a block diagram of broadband linearization according to an aspect of the present invention.

FIG. 21 illustrates an example embodiment 230 of an apparatus for performing broadband linearization according to the present invention. Output from a non-linear system 232 representing the TiSER, is digitized to produce digital output 234, which is equalized using a digital equalization filter and scaled 236 so that the obtained signal represents the original signal $X(\omega)$ 248 plus the nonlinear distortion component X'. It should be appreciated that the equalization filter is optional and may not be needed if the bandwidth of the system, as set by the dispersion penalty, is much larger than the bandwidth of the data this to be captured.

The signal $X(\omega)+X'$ is sent through a digital signal processing block 240 that emulates the transfer function of the physical system. Again, equalization 242 and scaling is performed on the obtained signal. As a result, under the assumption that the distortion component X' was small, the obtained signal is approximately equal to $X(\omega)+2X'$. This approximation holds because distortion components added in response to X' are negligible compared to X' itself. The scaling and equalization in the first step is necessary as it provides the same signal amplitude, although with a small additive distortion, which is important as the relative distortion added by any non-linear system is dependent on the amplitude of the original signal.

Another copy of the signal $X(\omega)+X'$ is doubled 246 in amplitude, and the signal obtained from previous steps (transfer function emulator+equalizer and scaler) is subtracted 244 from it. The resultant signal is the estimation of the original signal $X(\omega)$, which is the signal of interest. Since this approach assumes that the magnitude of the nonlinear distortion component X' is small compared to the original signal $X(\omega)$, whereby the approach is perhaps best suited for weakly non-linear systems.

The description of the invention generally assumes that non-linear distortion only arises in response to the fundamental process of photonic time stretch and ignores non-linear effects due to other components. In practice, however, aspects of the present invention can be used to correct for non-linear distortion due to these components as well.

Figure 22:
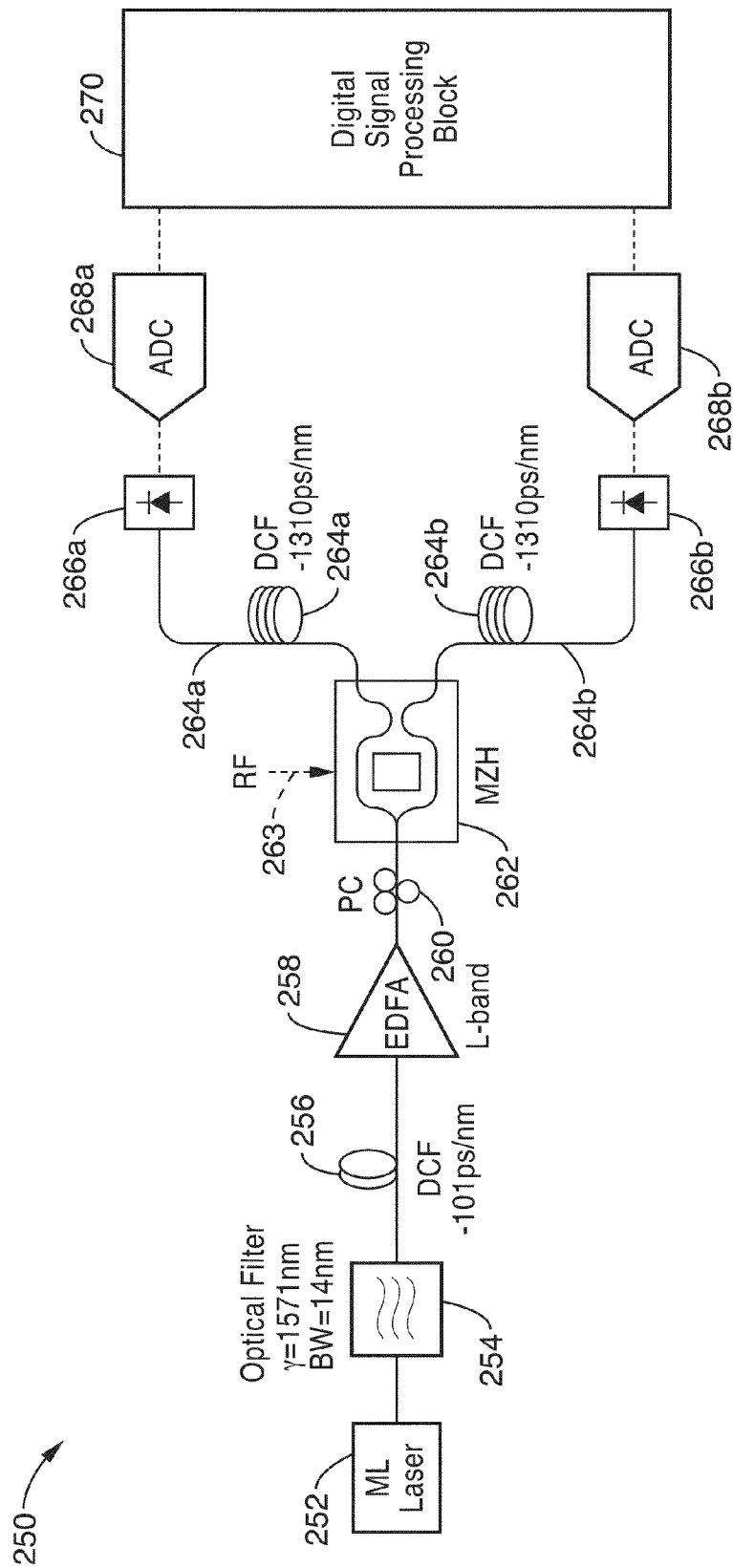
FIG. 22 is a block diagram of an experimental setup of photonic ADC broadband linearization according to an aspect of the present invention.

FIG. 22 illustrates an example embodiment 250 for demonstrating broadband linearization techniques applicable to a photonic Time-Stretch (TS) ADC. In this setup, optical pulses generated by a mode-locked laser (MLL) 252 (e.g., with 19 nm bandwidth) are filtered 254 and sent to a dispersion compensating fiber 256, such as having a dispersion value of −101 ps/nm. Pulses are then amplified 258, such as utilizing an Erbium Doped Fiber Amplifier (EDFA), and then polarization is corrected 260 prior to receipt of the pulses into the Mach-Zehnder (MZH) modulator 262, which receives a modulating RF signal 263, and has two optical outputs.

A Mach-Zehnder modulator (MZH) is configured to equally split an incoming optical signal and send it down two different optical paths, which after a short distance recombine, causing the optical waves to interfere with each other before the two signal exit the device. If the phase shift between the two waves is 0°, at the recombination point, then the interference is constructive and the light intensity at the output is high (on state). However, if the phase shift is 180°, then the interference is destructive and the light intensity at the output is zero (off state). The phase shift, and thus the output intensity, is controlled by changing the delay through one or both of the optical paths by means of the electro-optic effect, which arises in some materials such as lithium niobate (LiNbO3), certain semiconductors, and certain other materials to create a refractive index change in the presence of an electric field.

Modulated optical pulses are stretched in time using the second dispersion compensating fibers 264a, 264b. The stretched replicas 266a, 266b of the original signal, with an additional distortion due to time stretch, is finally obtained at the photodetectors (PDs) 268a, 268b coupled to ADCs 270a, 270b. After photodetection and digitization, the digital data undergoes signal processing 272 for broadband linearization. In terms of nonlinear distortions, the TS-ADC behaves similarly to an analog optical link and has a well-defined transfer characteristic. Thus, to generate the nonlinear distortions with memory effect, an analog optical link model has been used, which propagates a continuous-wave optical signal in the digital domain through the electro-optic modulator and the dispersive fiber.

The proposed broadband linearization technique is compared with a memoryless correction technique, for example, the arcsine operation. Arcsine operates on the basis that the Mach-Zehnder modulator intensity varies sinusoidally with respect to the input signal. Because of memory effect in the TS-ADC, the effectiveness the arcsine operation is limited to lower power and lower bandwidth signals.

By way of example and not limitation, a two-tone test was performed for 8.2 GHz and 10.25 GHz. Prior to performing the corrections for nonlinear distortions, corrections for $2^{nd}$ order distortions due to bias offset of the Mach-Zehnder modulator and time-warps were performed using the techniques described above.

Figure 23:
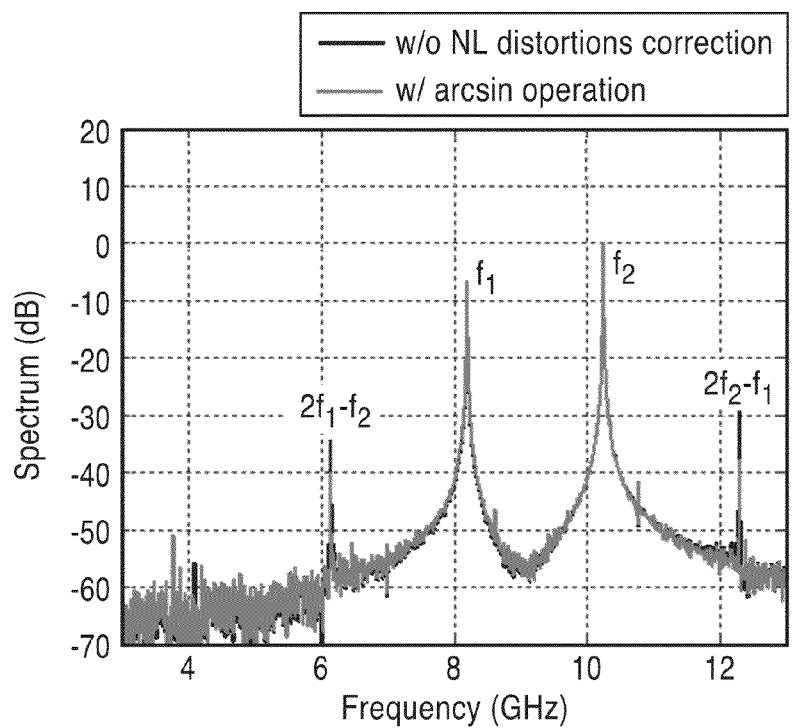
FIG. 23 is a graph of power spectra obtained for two-tone testing shown before and after arcsin operation.

FIG. 23 depicts power spectra of the extracted RF signal before and after arcsine correction for nonlinear distortions over a 10-GHz bandwidth obtained for the two-tone test (e.g., $f_1$=8.2 GHz, $f_2$=10.25 GHz). This figure shows that nonlinear distortions could be as high as −30 dB without correction, but can be reduced to −38 dB with memoryless correction.

Figure 24:
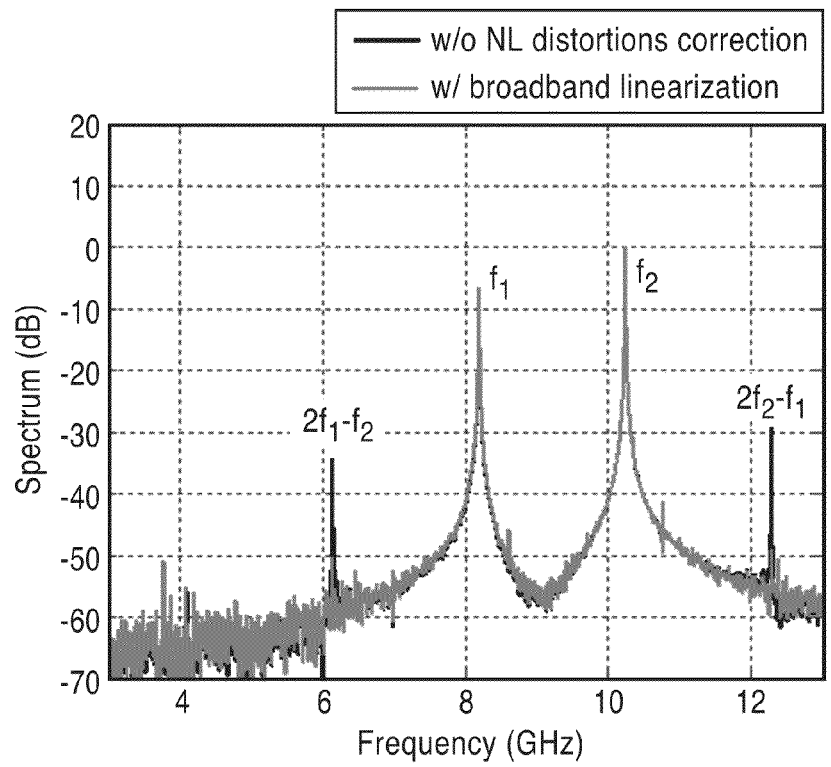
FIG. 24 is a graph of power spectra obtained for two-tone testing shown before and after broadband linearization.

FIG. 24 depicts power spectra obtained for the two-tone test (e.g., $f_1$=8.2 GHz, $f_2$=10.25 GHz) before and after broadband linearization. Results of broadband linearization shown in FIG. 24 illustrates that non-linear distortion can be suppressed to below −50 dB, which provides greater than 10 dB improvement over the arcsine operation under the same conditions.

8. CONCLUSION

As can be seen from the foregoing discussion, the present invention provides methods and apparatus for electrical signal measurement using time-stretched optical techniques in a real-time burst mode. Inventive teachings can be applied in a variety of apparatus and applications, including a time-stretched enhanced recording (TiSER) oscilloscope. It will be appreciated that the present invention includes the following inventive embodiments among others:

1. A time-stretched enhanced recording oscilloscope, comprising: a time stretch processor; said time stretch processor configured for coupling segments of an electrical input signal into a pulsed optical waveform; said input signal having an original time scale; wherein said pulsed optical waveform is temporally stretched in response to interaction with a dispersive optical medium; and wherein said input signal is time stretched when coupled into said pulsed optical waveform; a real-time electronic digitizer configured for registering and digitizing said input signal in its stretched form as contained within said pulsed optical waveform; and means for displaying said digitized input signal using its non-stretched original time scale for the oscilloscope.

2. An apparatus for measuring an electrical input signal, comprising: a pulsed optical source; a modulator configured for receiving said pulsed optical source; said modulator configured for modulating segments of a received electrical input signal over said pulsed optical source; a dispersion element configured for receiving said pulsed optical source from said modulator and stretching it in the time domain into a stretched optical source; an optical detector configured for receiving said stretched optical source and converting it into an analog signal; an analog-to-digital converter (ADC) configured for converting the stretched analog signal into a digital signal; a processing device configured for receiving said digital signal; and programming executable on said processing device for assembling said digital signal into a desired format of representation for said input signal; whereby said apparatus captures segments of said input signal in real-time and provides representation of fast repetitive signals and non-repetitive dynamics associated with said input signal.

3. An apparatus as recited in embodiment 2, wherein said pulsed optical source is configured with a mode-locked laser (MLL) coupled through a highly non-linear fiber (HNLF).

4. An apparatus as recited in embodiment 2, wherein said dispersion element comprises a dispersive optical fiber or a Fiber Bragg Grating (FBG).

5. An apparatus as recited in embodiment 2, wherein said modulator comprises a modulator selected from the group of modulators consisting of electro-optic modulators, Mach-Zehnder modulators, and electro-absorption modulators.

6. An apparatus as recited in embodiment 2, wherein said apparatus is configured for receiving high-voltage spikes exceeding approximately 1000 volts without damage, in response to receiving said input within a modulator.

7. An apparatus as recited in embodiment 2, wherein at least said modulator is separated from the remainder of said apparatus and coupled thereto with an optical fiber; and wherein the remainder of said apparatus is protected by distance and/or shielding and is not subject to the same physical conditions as said modulator.

8. An apparatus as recited in embodiment 2, wherein said analog-to-digital converter (ADC) is configured for converting the electrical equivalent of the stretched optical source and which operates at a substantially lower frequency than said input signal being captured by said apparatus.

9. An apparatus as recited in embodiment 2, wherein said stretching comprises stretching the input signal up to multiple orders of magnitude longer, in response to which an analog-to-digital converter circuit is utilized which is one or more orders of magnitude slower than bandwidth of the input source.

10. An apparatus as recited in embodiment 2, wherein said apparatus is configured for extracting signal information from clock synchronous signals from high speed serial data.

11. An apparatus as recited in embodiment 2, further comprising programming executable on said processing device for determining a bit-error rate (BER) from a high speed serial data stream and reducing the time required to measure bit-error rate.

12. An apparatus as recited in embodiment 2, wherein said apparatus provides for characterizing emerging high-speed serial data links selected from the group of high speed data links consisting of USB 3.0 targeting 5-Gbit/s serial data rates, PCI-Express at data rates up to 12.5-Gbit/s, OC-768 having data rates up to 43 Gbits/s, and Ethernet OTU4 having data rates up to 100-G bits/s.

13. An apparatus as recited in embodiment 2, further comprising programming executable on said processing device for performing time-domain reflectometry (TDR) comprising averaging repetitive reflected waveforms over multiple scans and increasing sensitivity and/or reducing test time.

14. An apparatus as recited in embodiment 2, wherein said apparatus is utilized to reduce the effect of clock jitter of the electronic digitizer in response to digitizing of the stretched signals at a slower rate than would be required by said input signal being directly digitized.

15. An apparatus as recited in embodiment 2, wherein said apparatus is utilized for developing equalization filters and equalization algorithms for compensating for inter-symbol interference (ISI) and other memory effects in received data.

16. An apparatus as recited in embodiment 2, further comprising: a digital signal processor configured for emulating a transfer function of a physical system under test and generating an emulated transfer function; an amplitude doubler and an adder which are in combination configured for receiving a scaled version of the output from said first equalization filter and subtracting the output of said second equalization filter to arrive at a linearized output for a time-stretched analog to digital converter (TS-ADC) which represents the original signal.

17. An apparatus as recited in embodiment 2, further comprising programming executable on said processing device for removing the influence of the laser pulse envelope by carrying out steps comprising: obtaining a maximum and a minimum of the laser pulse envelope across multiple pulses; determining envelope size in response to the difference between the maximum and minimum laser pulse envelopes; obtaining common mode noise in response to the sum of the maximum and minimum laser pulse envelopes; and subtracting common mode noise from the difference and dividing by the envelope size.

18. An apparatus as recited in embodiment 17, wherein said difference is determined in response to subtracting a negative modulation signal from a positive modulation signal.

19. An apparatus as recited in embodiment 2, further comprising programming executable on said processing device for removing time-warp distortion in response to: measuring of time-warp magnitude in response to capturing segments of a sample RF tone subject to a selected modulation, aligning and concatenating any adjacent parallel wavelength channels, fitting the resultant waveform to a curve for the selected modulation, and measuring the difference between the resultant waveform and the selected modulation; and correcting time warp distortion within arbitrary input signals received by said TS-ADC in response to using interpolation of the sample amplitudes.

20. An apparatus for recovering signals and removing distortion in a photonic Time Stretched Analog-to-Digital Converter (TS-ADC), comprising: a modulator configured for receiving a pulsed optical source and configured for modulating sequential segments of a received electrical input signal over a pulsed optical source; a plurality of dispersion elements configured for receiving segments of said pulsed optical source from said modulator and stretching them in the time domain into a plurality of stretched optical pulses containing the stretched analog signal; a plurality of optical detectors coupled to analog-to-digital converters (ADC) adapted for converting the stretched analog signal into a digital signal configured for receiving each of said stretched optical pulses and converting each of them into a digital signal; a digital multiplexer configured for combining each of the sequential segments of said digital signal into a single digital output; a processor coupled to said digital multiplexer; programming executable on said processor for performing one or more of the following digital signal processing steps to remove distortion as selected from the group of distortion removal processing consisting of: (a) performing broadband linearization by emulating a transfer function of the physical system under test which is subtracted from a scaled version of the captured waveform; (b) performing envelope correction by obtaining pulse envelope, common mode noise, and differential, then subtracting common mode noise from the differential and dividing by the envelope; (c) performing time warp removal to eliminate distortions resulting from non-uniform stretching across the optical spectrum based on interpolation of a model of time warp magnitude; and (d) performing bias offset removal in response to determining a second harmonic amplitude and subtracting a function of the harmonic amplitudes from the uncorrected signal.

21. A method of capturing waveforms in a real-time burst sampling mode, comprising: modulating a pulsed optical signal in response to receipt of an electrical input signal; stretching pulses within said pulsed optical signal in the time domain to stretch segments into stretched segments of said electrical input signal contained within said pulses; analog-to-digital conversion of said stretched segments of said input signal, using an analog-to-digital converter, into a digital signal representing real-time burst samples of said input signal; representing said stretched segments in an original time scale of said input signal as real-time burst samples; wherein each real-time burst sample represented in its original time scale comprises ultra-wideband signal segments captured in real-time at an equivalent sample rate exceeding the sample rate capability of said analog-to-digital converter.

22. A method as recited in embodiment 21, wherein said method is performed within a time-stretched enhanced recording (TiSER) oscilliscope.

23. A method as recited in embodiment 21, wherein said method provides real-time information about inter-symbol interference (ISI) for said input signal.

24. A method as recited in embodiment 21, wherein said method determines bit-error rate (BER) of a high speed serial data stream in response to analyzing captured real-time burst samples.

25. A method as recited in embodiment 21, wherein said real-time burst mode sampling method is configured for digital correction of data impairments.

26. A method as recited in embodiment 21, further comprising: performing a differential operation on stretched optical pulses; obtaining a maximum and a minimum value for a pulse envelope across multiple pulses; determining envelope size in response to determining a difference between the maximum and minimum pulse envelopes; obtaining common mode noise in response to determining a sum of the maximum and minimum pulse envelopes; and subtracting common mode noise from the difference and dividing by the envelope size resulting in removing laser pulse envelope distortion.

27. An apparatus for recovering signals and removing time-warp distortion in a photonic Time Stretched Analog-to-Digital Converter (TS-ADC), comprising: a modulator receiving a pulsed optical source and configured for modulating sequential segments of a received electrical input signal over said pulsed optical source; a plurality of dispersion elements configured for receiving segments of said pulsed optical source from said modulator and stretching them in the time domain into a plurality of stretched optical sources; a plurality of optical detectors coupled to analog-to-digital converters (ADC) for receiving each of said stretched optical sources and converting each of them into a digital signal; a multiplexer adapted for combining each of the sequential segments of digital signal into a single digital output; a processing device configured for receiving said digital signal; programming executable on said processing device for removal of time warp distortion by carrying out steps comprising: dividing time base of the digital signal by the amount of stretching performed; measuring time-warp magnitude in response to capturing segments of a sample RF tone subject to a selected modulation, aligning and concatenating any adjacent parallel wavelength channels, and fitting the resultant waveform to a curve for the selected modulation, and measuring the difference between the resultant waveform and the selected modulation, and correcting time warp distortion within arbitrary input signals received by said TS-ADC in response to using interpolation of the sample amplitudes.

28. An apparatus as recited in embodiment 27, wherein said selected modulation comprises sinusoidal modulation.

29. An apparatus as recited in embodiment 27, further comprising programming executable on said processing device for removal of wavelength dependent bias offsets of said modulator in response to determining second harmonic amplitude, and then subtracting a function of harmonic amplitudes from an input signal prior to its correction.

30. An apparatus as recited in embodiment 29, wherein said function of harmonic amplitude is determined in response to obtaining calibration data across channels, fitting a curve to the calibration data, and adding the timing offsets in zero crossings of positive edges and subtracting timing offsets in zero crossings of negative edges.

31. An apparatus as recited in embodiment 29, wherein said function of harmonic amplitudes is given by, $y(t)=x(t)-\delta(t)\cdot(2x^2(t)-1)$ in which $\delta(t)$ is the $2^{nd}$ harmonic amplitude which varies linearly with the wavelength, $x(t)$ uncorrected signal, and $y(t)$ is the resultant signal.

32. An apparatus as recited in embodiment 27, further comprising programming executable on said processing device for carrying out steps comprising: performing a differential operation on stretched optical source; obtaining a maximum and a minimum of a pulse envelope across multiple pulses from said pulsed optical source; determining envelope size in response to the differential between the maximum and minimum pulse envelopes; obtaining common mode noise in response to taking a sum of the maximum and minimum pulse envelopes; and subtracting common mode noise from the differential and dividing by the size of the envelope resulting in removing the influence of the laser pulse envelope.

33. An apparatus for performing broadband linearization for a time-stretched analog to digital converter (TS-ADC), comprising: a first equalization filter configured for equalizing a digital signal received from a time-stretched analog to digital converter (TS-ADC) and producing an output signal; a digital signal processor configured for receiving the output signal from said first equalization filter and configured for emulating a transfer function of the physical system under test and generating an emulated transfer function; a second equalization filter for equalizing an output of the emulated transfer function; and an adder configured for receiving a scaled version of the output signal from said first equalization filter and subtracting the output of said second equalization filter to arrive at a linearized output representing the original signal.

34. An apparatus as recited in embodiment 33, wherein said digital signal processor is further configured for: performing a differential operation on stretched optical source; obtaining a maximum and a minimum of a pulse envelope across multiple pulses; determining envelope size in response to the difference between the maximum and minimum pulse envelopes; obtaining common mode noise in response to determining a sum of the maximum and minimum pulse envelopes; and subtracting common mode noise from the difference and dividing by the size of the envelope resulting in removing the influence of the laser pulse envelope.

35. An apparatus for performing linearization and time-warp calibration for a time-stretched analog to digital converter (TS-ADC), comprising: a signal processor coupled to a TS-ADC which is configured for outputting a time-stretched digital signal in response to receipt of an analog RF signal; programming executable on said signal processor for removal of time warp distortion which is the non-uniform stretching across the optical spectrum, by carrying out steps comprising: generating time-warp calibration data for the TS-ADC in response to input of a sample RF tone with a selected modulation; correcting time warp distortion within arbitrary input signals received by said TS-ADC in response to interpolation of said time-warp calibration data; and generating a digital signal with time-warp distortion correction; a first equalization filter for equalizing a received digital signal from a time-stretched analog to digital converter; programming executable on said signal processor for emulating a transfer function of the physical system and generating an emulated transfer function, said signal processor configured for receiving the output of said first equalization filter; a second equalization filter for equalizing an output of the emulated transfer function; an adder receiving a scaled version of the output from said first equalization filter and subtracting an output of said second equalization filter to arrive at a linearized output representing the analog RF signal as originally received.

36. An apparatus as recited in embodiment 35, wherein generation of said time-warp calibration data, comprises: measuring time-warp magnitude in response to capturing segments of a sample RF tone subject to a selected modulation; aligning and concatenating any adjacent parallel wavelength channels; fitting a resultant waveform to a curve for the selected modulation; and measuring a difference between the resultant waveform and the selected modulation.

37. A method for removing time-warp distortion in a photonic Time Stretched Analog-to-Digital Converter (TS-ADC), comprising: measuring time-warp magnitude in response to capturing segments of a sample RF tone through the TS-ADC subject to a selected modulation; aligning and concatenating any adjacent parallel wavelength channels; fitting a resultant waveform to a curve for the selected modulation; measuring difference between the resultant waveform and the selected modulation; and correcting time warp distortion within arbitrary input signals received by said TS-ADC in response to using interpolation of sample amplitudes.

38. A method as recited in embodiment 37, wherein said selected modulation comprises sinusoidal modulation.

39. A method of linearizing a time-stretched analog to digital conversion, comprising: equalizing a received time-stretched digital signal into a first equalization signal; scaling up said first equalization signal into a first scaled equalization signal; emulating a transfer function of the physical system in response to receiving said first equalization signal; equalizing the output of the emulated transfer function into a second equalization signal; and subtracting said second equalization signal from said first scaled equalization signal to arrive at a linearized output representing the received time-stretched digital signal in its original form before being stretched.

40. An apparatus for measuring an electrical input signal, comprising: a pulsed optical source; a modulator configured for receiving said pulsed optical source; said modulator configured for modulating segments of a received electrical input signal over said pulsed optical source; a dispersion element configured for receiving said pulsed optical source from said modulator and stretching it in the time domain into a stretched optical source; an optical detector configured for receiving said stretched optical source and converting it into an analog signal; an analog-to-digital converter (ADC) configured for converting the stretched analog signal into a digital signal; a processing device configured for receiving said digital signal; and programming executable on said processing device for, assembling said digital signal into a desired format of representation for said input signal, emulating a transfer function of the physical system under test and generating an emulated transfer function, scaling said digital signal and subtracting said transfer function to arrive at a linearized output; whereby said apparatus captures segments of said input signal in real-time and provides representation of fast repetitive signals and non-repetitive dynamics associated with said input signal.

41. An apparatus as recited in embodiment 40, further comprising programming executable on said processor for removing time-warp distortion by the steps of: measuring time-warp magnitude in response to capturing segments of a sample RF tone through the TS-ADC subject to a selected modulation; aligning and concatenating any adjacent parallel wavelength channels; fitting a resultant waveform to a curve for the selected modulation; measuring difference between the resultant waveform and the selected modulation; and correcting time warp distortion within arbitrary input signals received by said TS-ADC in response to using interpolation of sample amplitudes.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An apparatus for measuring an electrical input signal, comprising:
    a pulsed optical source;
    a modulator configured for receiving said pulsed optical source;
    said modulator configured for modulating segments of a received electrical input signal over said pulsed optical source;
    a dispersion element configured for receiving said pulsed optical source from said modulator and stretching it in the time domain into a stretched optical source;
    an optical detector configured for receiving said stretched optical source and converting it into an analog signal;
    an analog-to-digital converter (ADC) configured for converting the analog signal into a digital signal;
    a processing device configured for receiving said digital signal; and
    programming executable on said processing device for assembling said digital signal into a desired format of representation for said input signal;
    whereby said apparatus captures segments of said input signal in real-time and provides representation of fast repetitive signals and non-repetitive dynamics associated with said input signal.

2. An apparatus as recited in claim 1, wherein said pulsed optical source is configured with a mode-locked laser (MLL) coupled through a highly non-linear fiber (HNLF).

3. An apparatus as recited in claim 1, wherein said dispersion element comprises a dispersive optical fiber or a Fiber Bragg Grating (FBG).

4. An apparatus as recited in claim 1, wherein said modulator comprises a modulator selected from the group of modulators consisting of electro-optic modulators, Mach-Zehnder modulators, and electro-absorption modulators.

5. An apparatus as recited in claim 1, wherein said modulator comprises a Mach-Zehnder modulator.

6. An apparatus as recited in claim 1, wherein said dispersion element comprises a dispersive optical fiber.

7. An apparatus as recited in claim 1, wherein said analog-to-digital converter (ADC) is configured for converting the electrical equivalent of the stretched optical source and which operates at a substantially lower frequency than said input signal being captured by said apparatus.

8. An apparatus as recited in claim 1, wherein said stretching comprises stretching the input signal up to multiple orders of magnitude longer, in response to which an analog-to-digital converter circuit is utilized which is one or more orders of magnitude slower than bandwidth of the input source.

9. An apparatus as recited in claim 1, wherein said apparatus is configured for extracting signal information from clock synchronous signals from high speed serial data.

10. An apparatus as recited in claim 1, further comprising programming executable on said processing device for determining a bit-error rate (BER) from a high speed serial data stream and reducing the time required to measure bit-error rate.

11. An apparatus as recited in claim 1, wherein said apparatus provides for characterizing emerging high-speed serial data links selected from the group of high speed data links consisting of USB 3.0 targeting 5-Gbit/s serial data rates, PCI-Express at data rates up to 12.5-Gbit/s, OC-768 having data rates up to 43 Gbits/s, and Ethernet OTU4 having data rates up to 100-Gbits/s.

12. An apparatus as recited in claim 1, further comprising programming executable on said processing device for performing time-domain reflectometry (TDR) comprising averaging repetitive reflected waveforms over multiple scans and increasing sensitivity and/or reducing test time.

13. An apparatus as recited in claim 1, wherein said apparatus is utilized to reduce the effect of clock jitter of the electronic digitizer in response to digitizing of the stretched signals at a slower rate than would be required by said input signal being directly digitized.

14. An apparatus as recited in claim 1, wherein said apparatus is utilized for developing equalization filters and equalization algorithms for compensating for inter-symbol interference (ISI) and other memory effects in received data.

15. An apparatus as recited in claim 1, further comprising:
    a digital signal processor configured for emulating a transfer function of a physical system under test and generating an emulated transfer function;
    an amplitude doubler and an adder which are in combination configured for receiving a scaled version of the output from said first equalization filter and subtracting the output of said second equalization filter to arrive at a linearized output for a time-stretched analog to digital converter (TS-ADC) which represents the original signal.

16. An apparatus as recited in claim 1, further comprising programming executable on said processing device for removing the influence of the laser pulse envelope by carrying out steps comprising:
    obtaining a maximum and a minimum of the laser pulse envelope across multiple pulses;
    determining envelope size in response to the difference between the maximum and minimum laser pulse envelopes;
    obtaining common mode noise in response to the sum of the maximum and minimum laser pulse envelopes; and
    subtracting common mode noise from the difference and dividing by the envelope size.

17. An apparatus as recited in claim 16, wherein said difference is determined in response to subtracting a negative modulation signal from a positive modulation signal.

18. An apparatus as recited in claim 1, further comprising programming executable on said processing device for removing time-warp distortion by,
    measuring of time-warp magnitude in response to capturing segments of a sample RF tone subject to a selected modulation, aligning and concatenating any adjacent parallel wavelength channels, fitting the resultant waveform to a curve for the selected modulation, and measuring the difference between the resultant waveform and the selected modulation; and
    correcting time warp distortion within arbitrary input signals received by said TS-ADC in response to using interpolation of the sample amplitudes.

* * * * *

UNITED STATES PATENT AND TRADEMARK OFFICE
CERTIFICATE OF CORRECTION

PATENT NO. : 8,432,153 B2  
APPLICATION NO. : 12/623359  
DATED : April 30, 2013  
INVENTOR(S) : Shalabh Gupta et al.

Page 1 of 1

It is certified that error appears in the above-identified patent and that said Letters Patent is hereby corrected as shown below:

Specification

Column 1, lines 18-20, change

"This invention was made with Government support of Grant No. N66001-07-1-2007 awarded by DARPA. The Government has certain rights in this invention."

to

-- This invention was made with Government support under N66001-07-1-2007, awarded by the Space and Naval Warfare Systems Command. The Government has certain rights in the invention. --

Signed and Sealed this  
Twenty-seventh Day of October, 2015

Michelle K. Lee  
*Director of the United States Patent and Trademark Office*